(12) United States Patent
Jeon

(10) Patent No.: US 11,930,678 B2
(45) Date of Patent: Mar. 12, 2024

(54) DISPLAY APPARATUS

(71) Applicant: Samsung Display Co., Ltd., Yongin-Si (KR)

(72) Inventor: Heechul Jeon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 54 days.

(21) Appl. No.: 17/214,755

(22) Filed: Mar. 26, 2021

(65) Prior Publication Data

US 2021/0376009 A1  Dec. 2, 2021

(30) Foreign Application Priority Data

May 26, 2020 (KR) .................... 10-2020-0063268

(51) Int. Cl.
*H10K 59/35* (2023.01)
*H10K 59/65* (2023.01)

(52) U.S. Cl.
CPC .......... *H10K 59/353* (2023.02); *H10K 59/65* (2023.02)

(58) Field of Classification Search
CPC ... H01L 27/3216–3218; H01L 27/3234; H01L 27/326; H01L 27/3225; H01L 27/3227; H10K 59/351–353; H10K 59/65
See application file for complete search history.

(56) References Cited

U.S. PATENT DOCUMENTS

| 7,609,310 | B2 | 10/2009 | Miyagawa |
| 10,733,931 | B2 | 8/2020 | Jung et al. |
| 10,748,984 | B2 | 8/2020 | Jeon |
| 2018/0039408 | A1* | 2/2018 | Cheong ................. G06F 3/0481 |
| 2020/0176716 | A1 | 6/2020 | Lee et al. |
| 2021/0065625 | A1* | 3/2021 | Wang ..................... G09G 3/2074 |
| 2021/0066427 | A1* | 3/2021 | Ma ......................... H01L 27/156 |
| 2021/0335955 | A1* | 10/2021 | Son ....................... H01L 27/3262 |
| 2021/0359053 | A1* | 11/2021 | Shan .................... H04M 1/0264 |
| 2022/0310712 | A1* | 9/2022 | Zhao .................... H01L 27/326 |

FOREIGN PATENT DOCUMENTS

| KR | 10-1015782 B1 | 2/2011 |
| KR | 10-2017-0024182 A | 3/2017 |
| KR | 10-2017-0104097 A | 9/2017 |
| KR | 10-2017-0113066 A | 10/2017 |
| KR | 10-2017-0113870 A | 10/2017 |

* cited by examiner

*Primary Examiner* — Eric K Ashbahian
(74) *Attorney, Agent, or Firm* — Innovation Counsel LLP

(57) ABSTRACT

Provided is a display apparatus. The display apparatus comprises a substrate including a display area, a first component area where first pixel groups including first auxiliary sub-pixels and first transmitting portions are located, and a second component area where second pixel groups including second auxiliary sub-pixels and second transmitting portions are located, first display elements, and second display elements, wherein one of the first pixel groups is spaced apart by a first distance in a first direction from a first center of the first component area, and is spaced apart by a second distance in a second direction intersecting the first direction from the first center, and one of the second transmitting portions is spaced apart by the first distance in the first direction from a second center of the second component area, and is spaced apart by the second distance in the second direction from the second center.

20 Claims, 17 Drawing Sheets

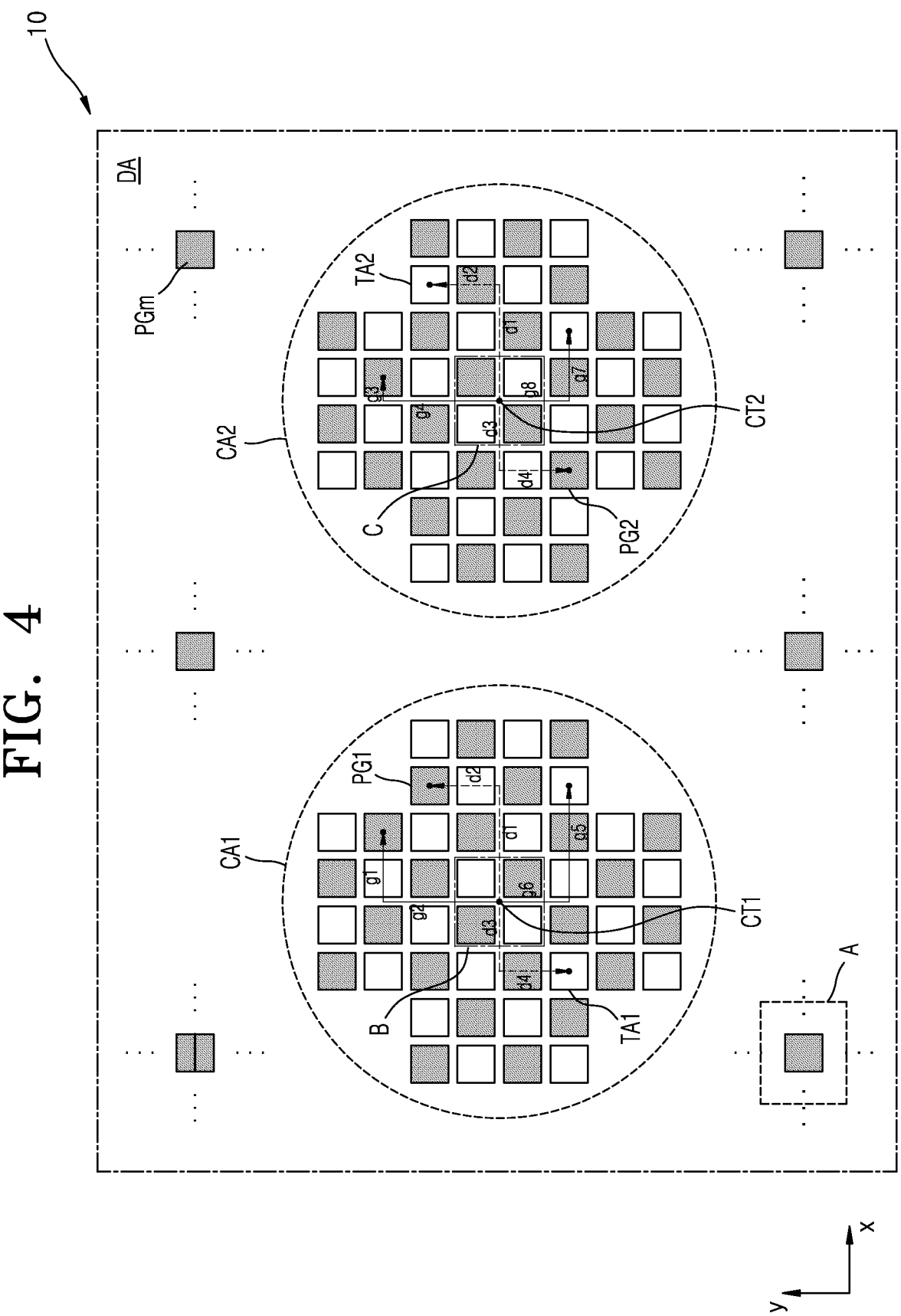

DISPLAY APPARATUS

CROSS-REFERENCE TO RELATED APPLICATION

This application is based on and claims priority under 35 U.S.C. § 119 to Korean Patent Application No. 10-2020-0063268, filed on May 26, 2020, in the Korean Intellectual Property Office, the disclosure of which is incorporated by reference herein in its entirety.

BACKGROUND

1. Field

One or more embodiments relate to a display apparatus, and more particularly, to a display apparatus including a transmitting portion.

2. Description of Related Art

Recently, display devices have been used on various electronic devices for different purposes. Since sizes and weights of display devices have decreased, the range of applications for display devices has dramatically increased.

As a display area in a display device has increased, various functions associated with the display device have increased. In order to increase an area while adding various functions, research on a display device having a component area where images are displayed and various functions are performed has increased recently.

A pixel group for displaying images and a transmitting portion may be located in the component area. In this case, when the area of the transmitting portion in the component area increases, a transmittance may increase but a resolution may decrease. When the area of the pixel group in the component area increases, a resolution may increase but a transmittance may decrease. A novel way to develop a display device to maintain a resolution and to increase a transmittance of a component area for performing various functions is, therefore, needed.

SUMMARY

One or more embodiments provide a display apparatus for maintaining a resolution and increasing a transmittance of a component area.

Additional aspects will be set forth in part in the description which follows and, in part, will be apparent from the description, or may be learned by practice of the presented embodiments of the disclosure.

According to one or more embodiments, a display apparatus includes a substrate including a display area, a first component area where first pixel groups including first auxiliary sub-pixels and first transmitting portions are located, and a second component area where second pixel groups including second auxiliary sub-pixels and second transmitting portions are located, first display elements for implementing the first auxiliary sub-pixels, and second display elements for implementing the second auxiliary sub-pixels, wherein one of the first pixel groups is spaced by a first distance in a first direction from a first center of the first component area, and is spaced by a second distance in a second direction intersecting the first direction from the first center, and one of the second transmitting portions is spaced by the first distance in the first direction from a second center of the second component area, and is spaced by the second distance in the second direction from the second center.

One of the second pixel groups may be spaced by a third distance in the first direction from the second center, and may be spaced by a fourth distance in the second direction from the second center, and one of the first transmitting portions may be spaced by the third distance in the first direction from the first center, and may be spaced by the fourth distance in the second direction from the second center.

Main pixel groups including main sub-pixels may be located in the display area, wherein the display apparatus further includes main display elements for implementing the main sub-pixels, wherein, in the same area, the number of the main sub-pixels is greater than the number of the first auxiliary sub-pixels.

In the same area, the number of the main sub-pixels may be twice the number of the first auxiliary sub-pixels.

In the same area, the number of the main sub-pixels may be four times the number of the first auxiliary sub-pixels.

The first auxiliary sub-pixels may include a red sub-pixel, a green sub-pixel, and a blue sub-pixel.

The red sub-pixel, the green sub-pixel, and the blue sub-pixel may form a virtual quadrangular shape, wherein the red sub-pixel and the blue sub-pixel are located at vertices of the virtual quadrangular shape to face a center point of the virtual quadrangular shape, and the green sub-pixel is located at the center point of the virtual quadrangular shape.

The substrate may further include a third component area where third pixel groups including third auxiliary sub-pixels and third transmitting portions are located, wherein the display apparatus further includes third display elements for implementing the third auxiliary sub-pixels.

The first component area may include a first area and a second area surrounding the first area, wherein, in the same area, the number of the first pixel groups located in the first area is less than the number of the first pixel groups located in the second area.

The first component area may include a first area and a second area surrounding the first area, wherein, in the same area, an area occupied by the first transmitting portions in the first area is greater than an area occupied by the first transmitting portions in the second area.

The display apparatus may further include a first component located under the first component area, and a second component located under the second component area.

The first component and the second component may be cameras.

According to one or more embodiments, a display apparatus includes a substrate including a display area, a first component area where first pixel groups including first auxiliary sub-pixels and first transmitting portions are located, and a second component area where second pixel groups including second auxiliary sub-pixels and second transmitting portions are located, first display elements for implementing the first auxiliary sub-pixels, and second display elements for implementing the second auxiliary sub-pixels, wherein one of the first pixel groups is spaced by a first interval in a first direction from a first center of the first component area, and is spaced by a second interval in a second direction intersecting the first direction from the first center, and one of the second pixel groups is spaced by a third interval in the first direction from a second center of the second component area, and is spaced by a fourth interval in the second direction from the second center, wherein a difference between the first interval and the third interval is a distance between a center of the first transmitting portion and a center of the first pixel group adjacent to each other in the first direction.

One of the first transmitting portions may be spaced by a fifth interval in the first direction from the first center, and may be spaced by a sixth interval in the second direction from the first center, and one of the second transmitting portions may be spaced by a seventh interval in the first direction from the second center, and may be spaced by an eighth interval in the second direction from the second center, wherein a difference between the fifth interval and the seventh interval is a distance between a center of the first transmitting portion and a center of the first pixel group adjacent to each other in the first direction.

Main pixel groups including main sub-pixels may be located in the display area, wherein the display apparatus further includes main display elements for implementing the main sub-pixels, wherein, in the same area, the number of the main sub-pixels is greater than the number of the first auxiliary sub-pixels.

The first auxiliary sub-pixels may include a red sub-pixel, a green sub-pixel, and a blue sub-pixel, wherein the red sub-pixel, the green sub-pixel, and the blue sub-pixel form a virtual quadrangular shape, wherein the red sub-pixel and the blue sub-pixel are located at vertices of the virtual quadrangular shape to face a center of the virtual quadrangular shape, and the green sub-pixel is located at the center of the virtual quadrangular shape.

The first component area may include a first area and a second area surrounding the first area, wherein, in the same area, the number of the first pixel groups located in the first area is less than the number of the first pixel groups located in the second area.

According to one or more embodiments, a display apparatus includes a substrate including a display area, a first component area where first pixel groups including first auxiliary sub-pixels and first transmitting portions are located, and a second component area where second pixel groups including second auxiliary sub-pixels and second transmitting portions are located, first display elements for implementing the first auxiliary sub-pixels, and second display elements for implementing the second auxiliary sub-pixels, wherein the first component area and the second component area are located on both sides of a center line extending in a first direction or a second direction intersecting the first direction to be spaced apart from each other.

One of the first pixel groups may be spaced by a first distance in the first direction from a first center of the first component area, and may be spaced by a second distance in the second direction from the first center, and one of the second transmitting portions may be spaced by the first distance in the first direction from a second center of the second component area, and may be spaced by the second distance in the second direction from the second center.

The display apparatus may be folded about the center line.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4 is a plan view illustrating part of a display panel according to an embodiment;

DETAILED DESCRIPTION

Figure 1:
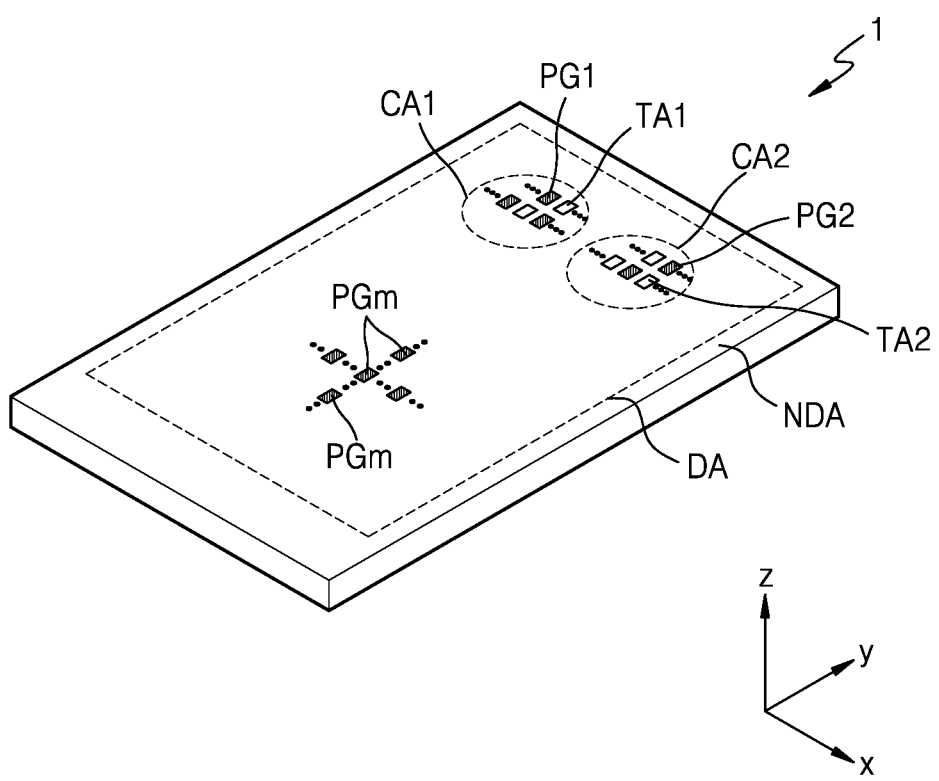
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, specific embodiments will be illustrated in the drawings and described in detail in the written description. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Reference will now be made in detail to embodiments, examples of which are illustrated in the accompanying drawings, and in the drawings, the same elements are denoted by the same reference numerals and a repeated explanation will be omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "on" another layer, region, or element, it may be directly on the other layer, region, or element or may be indirectly on the other layer, region, or element with intervening layers, regions, or elements therebetween.

Sizes of elements in the drawings may be exaggerated or contracted for convenience of explanation. For example, because sizes and thicknesses of elements in the drawings are arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

A display apparatus 1 that is a device for displaying an image may be a portable mobile device such as a game player, a multimedia device, or a mini PC. Examples of the display apparatus 1 described below may include a liquid-crystal display, an electrophoretic display, an organic light-emitting display, an inorganic light-emitting display, a field-emission display, a surface-conduction electron-emitter display, a quantum dot display, a plasma display, and a cathode ray display. Although an organic light-emitting display apparatus is used as the display apparatus 1 according to an embodiment, any of various display apparatuses as described above may be used.

FIG. 1 is a perspective view of the display apparatus 1 according to an embodiment.

Referring to FIG. 1, the display apparatus 1 may include a display area DA, a first component area CA1, a second component area CA2, and a non-display area NDA.

An image may be formed in the display area DA. Main pixel groups PGm including main sub-pixels may be located in the display area DA. In this case, a first image may be provided by using light emitted by the main sub-pixels.

An image may be formed and a component (not shown) may be located in each of the first component area CA1 and the second component area CA2. A first component may be located in the first component area CA1, and a second component may be located in the second component area CA2. The first component area CA1 and the second component area CA2 may be areas under which the first component and the second component such as sensors or cameras using infrared rays, visible light, or sound are located as described below with reference to FIG. 2.

In an embodiment, at least one of the first component area CA1 and the second component area CA2 may be at least partially surrounded by the display area DA. For example, each of the first component area CA1 and the second component area CA2 may be entirely surrounded by the display area DA. In another embodiment, at least one of the first component area CA1 and the second component area CA2 may be located as a bar type on a side of the display area DA2. For convenience of explanation, the following will be described assuming that each of the first component area CA1 and the second component area CA2 is entirely surrounded by the display area DA.

In an embodiment, at least one of the first component area CA1 and the second component area CA2 may have a circular or elliptical shape in a plan view. In another embodiment, at least one of the first component area CA1 and the second component area CA2 may have a polygonal shape such as a quadrangular shape in a plan view. In another embodiment, at least one of the first component area CA1 and the second component area CA2 may include a curved portion. For convenience of explanation, the following will be described assuming that each of the first component area CA1 and the second component area CA2 has a circular shape.

A first transmitting portion TA1 and a first pixel group PG1 may be located in the first component area CA1. Light and/or sound output from the first component to the outside or traveling from the outside toward the first component may be transmitted through the first transmitting portion TA1. A pixel is not located in the first transmitting portion TA1. In this case, when visible light is transmitted through the first transmitting portion TA1, a visible light transmittance of the first component area CA1 may be equal to or greater than about 15%, more preferably equal to or greater than about 20%, 25%, 85%, or 90%. The first pixel group PG1 may include first auxiliary sub-pixels, and may provide a second image by using light emitted by the first auxiliary sub-pixels.

A second transmitting portion TA2 and a second pixel group PG2 may be located in the second component area CA2. Light and/or sound output from the second component to the outside or traveling from the outside toward the second component may be transmitted through the second transmitting portion TA2. A pixel is not located in the second transmitting portion TA2. In this case, when visible light is transmitted through the second transmitting portion TA2, a visible light transmittance of the second component area CA2 may be equal to or greater than about 15%, more preferably equal to or greater than about 20%, 25%, 85%, or 90%. The second pixel group PG2 may include second auxiliary sub-pixels, and may provide a third image by using light emitted by the second auxiliary sub-pixels. In this case, the first image, the second image, and the third image may be parts of one image provided by the display apparatus 1. Alternatively, the first image, the second image, and the third image may be independent images separate from one another.

A pixel is not located in the non-display area NDA where an image is not provided. The non-display area NDA may entirely surround the display area DA. A driver or the like for providing an electrical signal or power to the main pixel group PGm, the first pixel group PG1, and the second pixel group PG2 may be located in the non-display area NDA. A pad unit to which an electronic device or a printed circuit board may be electrically connected may be included in the non-display area NDA.

In the present embodiment, the display apparatus 1 may be folded. In this case, the display apparatus 1 may be folded about a folding axis (not shown) crossing the display area DA. The folding axis may extend in a first direction (x-direction) or a second direction (y-direction). In this case, the second direction may intersect the first direction. For example, the first direction and the second direction may form an acute angle or an obtuse angle. In another embodiment, the first direction and the second direction may intersect each other. The following will be described assuming that the first direction and the second direction intersect each other.

That is, the folding axis may extend in the first direction or the second direction. In some embodiments, the display apparatus 1 may have a plurality of axes.

Figure 2:
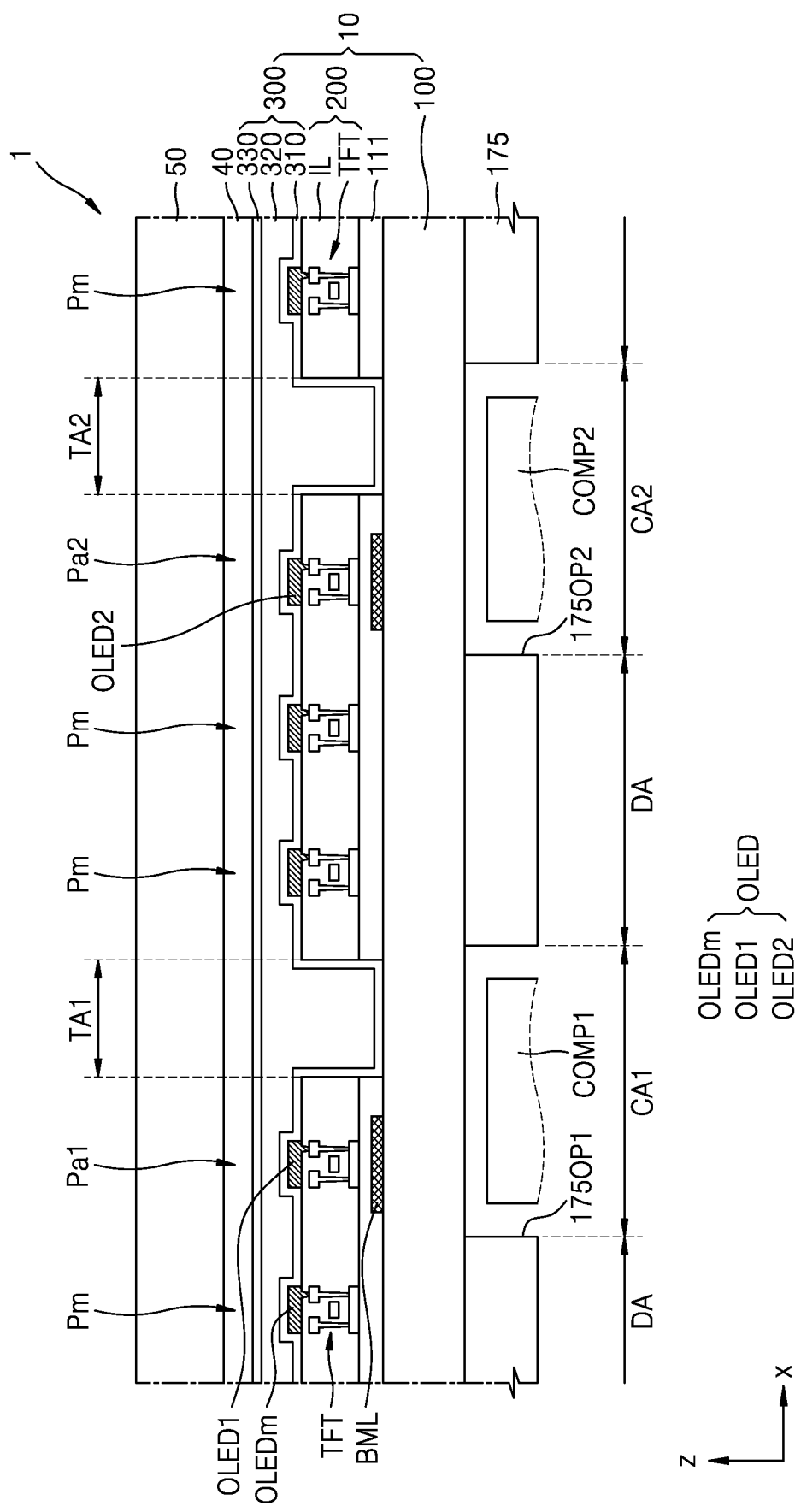
FIG. 2 is a cross-sectional view illustrating a part of the display apparatus according to an embodiment.

FIG. 2 is a cross-sectional view illustrating a part of the display apparatus 1 according to an embodiment.

Referring to FIG. 2, the display apparatus 1 may include a display panel 10 and a first component COMP1 and a second component COMP2 overlapping the display panel 10. Furthermore, the display apparatus 1 may include a touch input layer 40 and an optical functional layer 50.

The display panel 10 may include a substrate 100, a display layer 200, and an encapsulation layer 300. The display panel 10 may include the display area DA, the first component area CA1, and the second component area CA2. In an embodiment, the display area DA, the first component area CA1, and the second component area CA2 may be defined in the substrate 100. That is, the substrate 100 may include the display area DA, the first component area CA1, and the second component area CA2.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multi-layer structure including a base layer including the polymer resin and a barrier layer (not shown).

The display layer 200 may be located on a top surface of the substrate 100. A lower protective film 175 may be attached to the bottom surface of the substrate 100, which is opposite to the top surface of the substrate 100. An adhesive layer (not shown) may be located between the lower protective film 175 and the substrate 100. Alternatively, the lower protective film 175 may be directly formed on the bottom surface of the substrate 100, and in this case, the adhesive layer may not be located between the lower protective film 175 and the substrate 100.

The lower protective film 175 may support and protect the substrate 100. The lower protective film 175 may have a first opening 175OP1 corresponding to the first component area CA1. Because the lower protective film 175 has the first opening 175OP1, a transmittance of the first component area CA1, e.g., a light transmittance of the first transmitting portion TA1, may increase. Also, the lower protective film 175 may have a second opening 175OP2 corresponding to the second component area CA2. Because the lower protective film 175 has the second opening 175OP2, a transmittance of the second component area CA2, e.g., a light transmittance of the second transmitting portion TA2, may increase. The lower protective film 175 may include polyethylene terephthalate or polyimide. When the substrate 100 includes glass, the lower protective film 175 may be omitted.

The display layer 200 may include a buffer layer 111, an insulating layer IL, a thin-film transistor TFT, and an organic light-emitting diode OLED that is a display element. A main sub-pixel Pm of a main pixel group may be located in the display area DA. A first auxiliary sub-pixel Pa1 of a first pixel group may be located in the first component area CA1, and a second auxiliary sub-pixel Pa2 of a second pixel group may be located in the second component area CA2.

The thin-film transistor TFT and the organic light-emitting diodes OLED electrically connected to the thin-film transistor (TFT) may be located in each of the display area DA, the first component area CA1, and the second component area CA2. In this case, a main organic light-emitting diode OLEDm that is a main display element for implementing the main sub-pixel Pm may be located in the display area DA. Furthermore, a first organic light-emitting diode OLED1 that is a first display element for implementing the first auxiliary sub-pixel Pa1 may be located in the first component area CA1, and a second organic light-emitting diode OLED2 that is a second display element for implementing the second auxiliary sub-pixel Pa2 may be located in the second component area CA2.

The first component area CA1 may include the first transmitting portion TA1 where a thin-film transistor TFT and an organic light-emitting diode OLED are not located. Furthermore, the second component area CA2 may include the second transmitting portion TA2 where the thin-film transistor TFT and the organic light-emitting diode OLED are not located.

The buffer layer 111 may be located on the substrate 100, and may reduce or prevent penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material. In some embodiments, the buffer layer 111 may include silicon oxide or silicon nitride.

In an embodiment, a lower metal layer BML may be located in at least one of the first component area CA1 and the second component area CA2. In this case, the lower metal layer BML may be located to correspond to at least one of the first auxiliary sub-pixel Pa1 and the second auxiliary sub-pixel Pa2. Accordingly, the lower metal layer BML may prevent external light from reaching the thin-film transistor TFT. A constant voltage or a signal may be applied to the lower metal layer BML, thereby preventing damage to a pixel circuit due to electrostatic discharge. Although not shown in FIG. 2, in some embodiments, the lower metal layer BML may be located under the main sub-pixel Pm in the display area DA.

The lower metal layer BML may be located between the substrate 100 and the buffer layer 111. Alternatively, the buffer layer 111 may include a first buffer layer and a second buffer layer, and the lower metal layer BML may be located between the first buffer layer and the second buffer layer. The following will be described assuming that the lower metal layer BML is located between the substrate 100 and the buffer layer 111.

In an embodiment, each of the buffer layer 111 and the insulating layer IL may have a transmission hole (not shown). Accordingly, a transmittance of light and/or a signal output from the first component COMP1 to the outside or traveling from the outside toward the first component COMP1 may increase. In some embodiments, each of the buffer layer 111 and the insulating layer IL may not have a transmission hole.

The encapsulation layer 300 may cover the display layer 200. In an embodiment, the encapsulation layer 300 may include at least one inorganic encapsulation layer and at least one organic encapsulation layer. In this regard, FIG. 2 illustrates a first inorganic encapsulation layer 310, a second inorganic encapsulation layer 330, and an organic encapsulation layer 320 between the first inorganic encapsulation layer 310 and the second inorganic encapsulation layer 330.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate.

In another embodiment, the encapsulation layer 300 may be an encapsulation substrate. In this case, the encapsulation substrate may face the substrate 100 with the display layer 200 therebetween. There may be a gap between the encapsulation substrate and the display layer 200. The encapsulation substrate may include glass. A sealant may be located between the substrate 100 and the encapsulation substrate, and the sealant may be located in the non-display area NDA described with reference to FIG. 1. The sealant located in the non-display area NDA may surround the display area DA and may prevent penetration of moisture through a side surface.

A touch input layer 40 may be located on the encapsulation layer 300. The touch input layer 40 may obtain coordinate information in response to an external input, e.g., a touch event. The touch input layer 40 may include a touch electrode and trace lines connected to the touch electrode. The touch input layer 40 may detect the external input by using a mutual capacitance method or a self capacitance method.

The touch input layer 40 may be formed on the encapsulation layer 300. Alternatively, the touch input layer 40 may be separately formed and then may be coupled to the encapsulation layer 300 through an adhesive layer such as an optically clear adhesive (OCA). In an embodiment, the touch input layer 40 may be directly formed on the encapsulation layer 300 as shown in FIG. 2, and in this case, the adhesive layer may not be located between the touch input layer 40 and the encapsulation layer 300.

An optical functional layer 50 may be located on the touch input layer 40. The optical functional layer 50 may include an anti-reflection layer. The anti-reflection layer may reduce a reflectance of light (external light) incident on the display apparatus 1.

In some embodiments, the anti-reflection layer may include an optical plate including a phase retarder and/or a polarizer. The phase retarder may be of a film type or a liquid-crystal coating type, and may include a λ/2 phase retarder and/or a λ/4 phase retarder. The polarizer may also be of a film type or a liquid-crystal coating type. The polarizer of the film type may include an elongated synthetic resin film, and the polarizer of the liquid-crystal coating type may include liquid crystals arranged with a certain orientation.

In some embodiments, the anti-reflection layer may include a filter plate including a black matrix and color filters. The color filters may be arranged in consideration of a color of light emitted by each of pixels. For example, each color filter may have a red, green, or blue color according to a color of light emitted by the organic light-emitting diode OLED. The color filter and the black matrix do not exist in the first transmitting portion TA1 and the second transmitting portion TA2.

In some embodiments, the anti-reflection layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

The first component COMP1 may be located in the first component area CA1. In an embodiment, the first component COMP1 may be located to correspond to the first opening 175OP1.

The first component COMP1 may be an electronic element using light or sound. For example, the electronic element may be a sensor that measures a distance such as a proximity sensor, a sensor that recognizes a user's body part (e.g., fingerprint, iris, or face), a small lamp that outputs light, or an image sensor (e.g., a camera) that captures an image. The electronic element using light may use light of any of various wavelength bands such as visible light, infrared light, or ultraviolet light. The electronic element using sound may use ultrasound or sound of another frequency band.

In some embodiments, the first component COMP1 may include sub-components such as a light emitter and a light receiver. The light emitter and the light receiver may be integrated or may be physically separated, to constitute one first component COMP1.

The second component COMP2 may be located in the second component area CA2. The second component COMP2 may be located to correspond to the second opening 175OP2. The second component COMP2 may be an electronic element using light or sound. The second component COMP2 is similar to the first component COMP1, and thus a detailed explanation will be omitted.

Figure 3A:
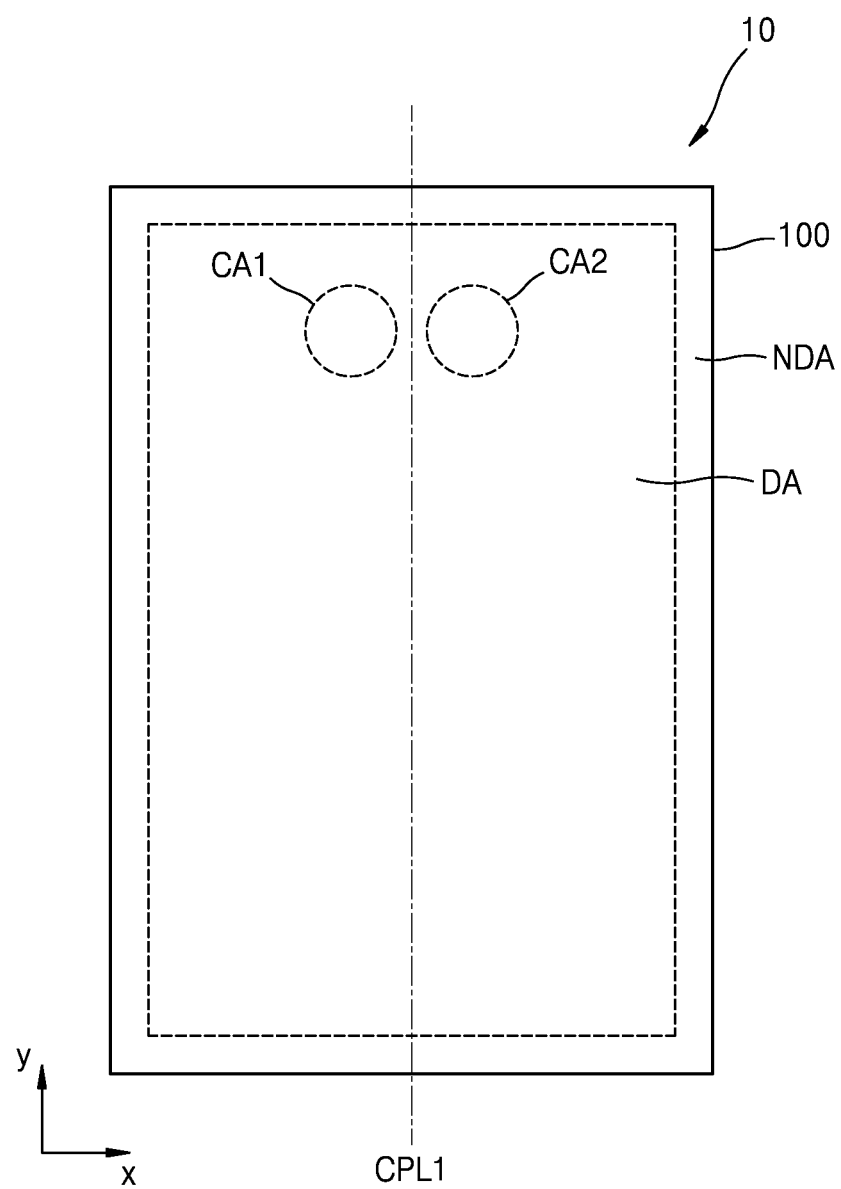
FIG. 3A is a plan view of a display panel according to an embodiment.

FIG. 3A is a plan view of the display panel 10 according to an embodiment.

Referring to FIG. 3A, the display panel 10 may include the display area DA, the first component area CA1 where a first transmitting portion and a first pixel group are located, the second component area CA2 where a second transmitting portion and a second pixel group are located, and the non-display area NDA surrounding the display area DA. In an embodiment, the display area DA, the first component area CA1, the second component area CA2, and the non-display area NDA may be defined in the substrate 100. That is, the substrate 100 may include the display area DA, the first component area CA1, the second component area CA2, and the non-display area NDA.

In the present embodiment, the first component area CA1 and the second component area CA2 may be located adjacent to each other. For example, the first component area CA1 and the second component area CA2 may be arranged in the first direction (x-direction) or the second direction (y-direction). Alternatively, the first component area CA1 and the second component area CA2 may be located in a direction intersecting the first direction (x-direction) and the second direction (y-direction). In FIG. 3A, the first component area CA1 and the second component area CA2 are arranged in the first direction (x-direction).

In an embodiment, the first component area CA1 and the second component area CA2 may be located on both sides a first center line CPL1 to be spaced apart from each other. In this case, the first center line CPL1 may extend in the first direction (x-direction) or the second direction (y-direction) intersecting the first direction (x-direction).

In an embodiment, the first center line CPL1 may halve the display area DA. For example, the first center line CPL1 may halve the display area DA, and may extend in the second direction (y-direction). In this case, the first component area CA1 may be located on the left side of the first center line CPL1, and the second component area CA2 may be located on the right side of the first center line CPL1.

In an embodiment, the display panel 10 may be folded about the first center line CPL1. In another embodiment, the display panel 10 may be folded about a second center line (not shown) perpendicular to the first center line CPL1. That is, the display panel 10 may be folded in the second direction (y-direction).

In an embodiment, a distance between the center of the first component area CA1 and the first center line CPL1 may be the same as a distance between the center of the second component area CA2 and the first center line CPL1. In another embodiment, a distance between the center of the first component area CA1 and the first center line CPL1 may be different from a distance between the center of the second component area CA2 and the first center line CPL1.

Figure 3B:
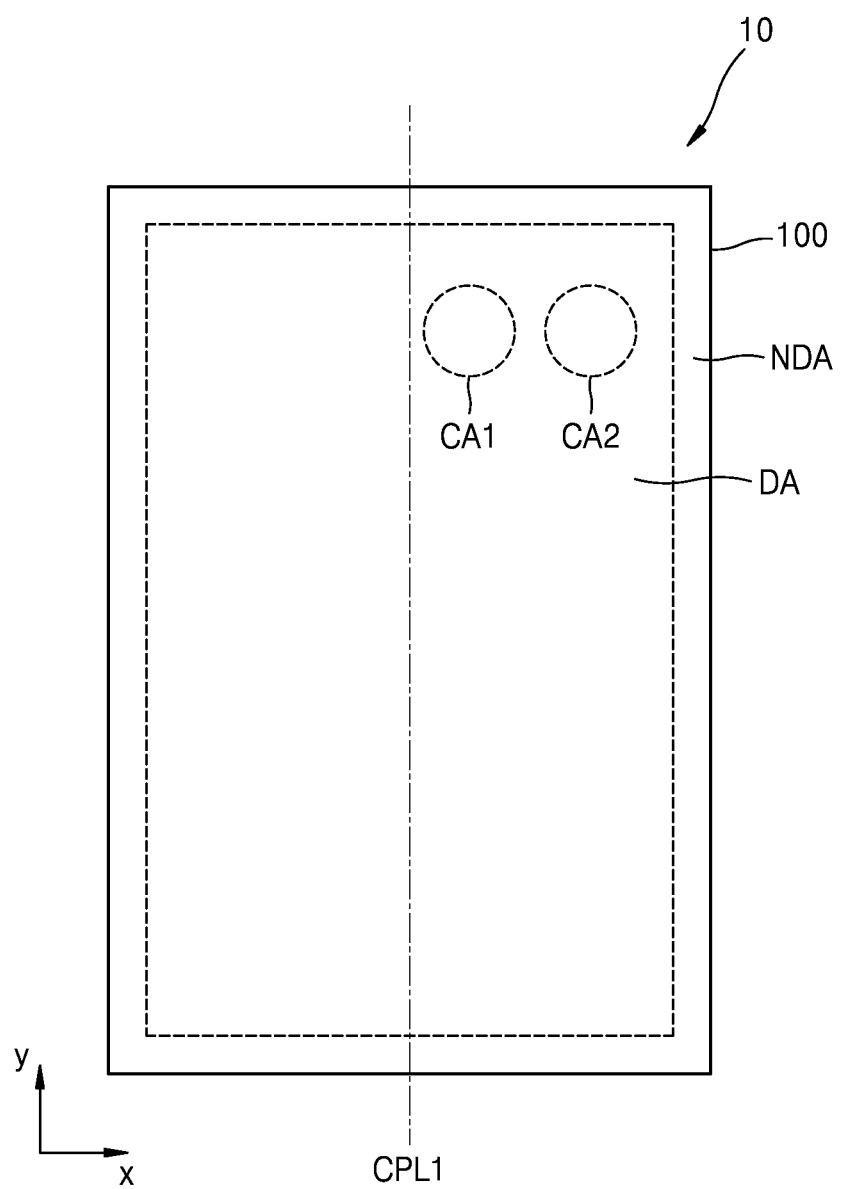
FIG. 3B is a plan view of the display panel according to an embodiment.

FIG. 3B is a plan view of the display panel 10 according to an embodiment. In FIG. 3B, the same members as those of FIG. 3A are denoted by the same reference numerals, and thus a repeated explanation will be omitted.

Referring to FIG. 3B, the display panel 10 may include the display area DA, the first component area CA1 where a first transmitting portion and a first pixel group are located, the second component area CA2 where a second transmitting portion and a second pixel group are located, and the non-display area NDA surrounding the display area DA. In an embodiment, the display area DA, the first component area CA1, the second component area CA2, and the non-display area NDA may be defined in the substrate 100. That is, the substrate 100 may include the display area DA, the first component area CA1, the second component area CA2, and the non-display area NDA.

In the present embodiment, the first component area CA1 and the second component area CA2 may be located adjacent to each other. In FIG. 3B, the first component area CA1 and the second component area CA2 are arranged in the first direction (x-direction).

In the present embodiment, the first component area CA1 and the second component area CA2 may be located to correspond to an edge portion of the substrate 100. Although the first component area CA1 and the second component area CA2 are located on an upper right portion of the substrate 100 in FIG. 3B, the first component area CA1 and the second component area CA2 may be located on a lower right portion, an upper left portion, or a lower left portion.

Figure 3C:
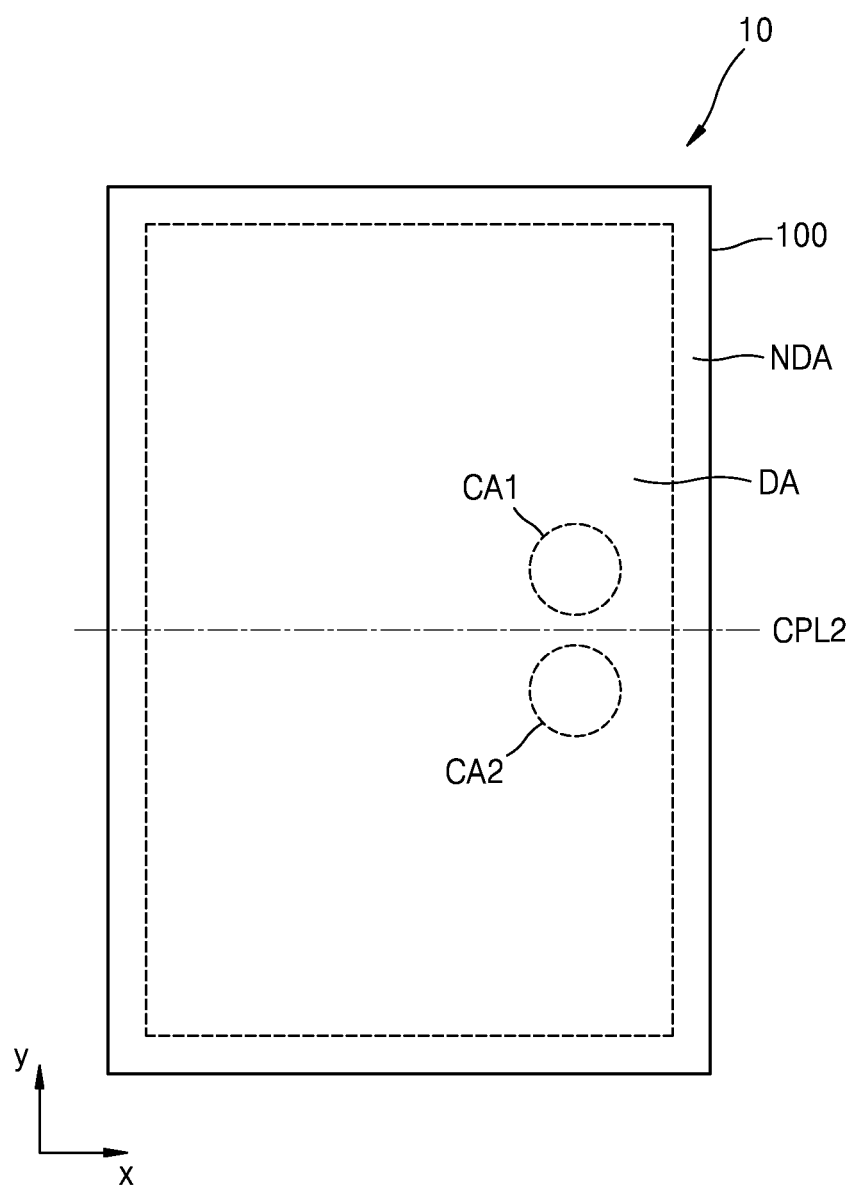
FIG. 3C is a plan view of the display panel according to an embodiment.

FIG. 3C is a plan view of the display panel 10 according to an embodiment. In FIG. 3C, the same members as those of FIG. 3A are denoted by the same reference numerals, and thus a repeated explanation will be omitted.

Referring to FIG. 3C, the display panel 10 may include the display area DA, the first component area CA1 where a first transmitting portion and a first pixel group are located, the second component area CA2 where a second transmitting portion and a second pixel group are located, and the non-display area NDA surrounding the display area DA. In an embodiment, the display area DA, the first component area CA1, the second component area CA2, and the non-display area NDA may be defined in the substrate 100. That is, the substrate 100 may include the display area DA, the first component area CA1, the second component area CA2, and the non-display area NDA.

In the present embodiment, the first component area CA1 and the second component area CA2 may be located adjacent to each other. In FIG. 3C, the first component area CA1 and the second component area CA2 are arranged in the second direction (y-direction).

In the present embodiment, the first component area CA1 and the second component area CA2 may be located on both sides a second center line CPL2 to be spaced apart from each other. In this case, the second center line CPL2 may extend in the first direction (x-direction).

In an embodiment, the second center line CPL2 may halve the display area DA. For example, the second center line CPL2 may halve the display area DA and may extend in the first direction (x-direction). In this case, the first component area CA1 may be located above the second center line CPL2, and the second component area CA2 may be located below the second center line CPL2.

In an embodiment, the display panel 10 may be folded about the second center line CPL2. In another embodiment, the display panel 10 may be folded about a first center line (not shown) perpendicular to the second center line CPL2. That is, the display panel 10 may be folded about in the first direction (x-direction).

In an embodiment, a distance from the center of the first component area CA1 to the second center line CPL2 may be the same as a distance from the center of the second component area CA2 to the second center line CPL2. In another embodiment, a distance between the center of the first component area CA1 and the second center line CPL2 may be different from a distance between the center of the second component area CA2 and the second center line CPL2.

Figure 3D:
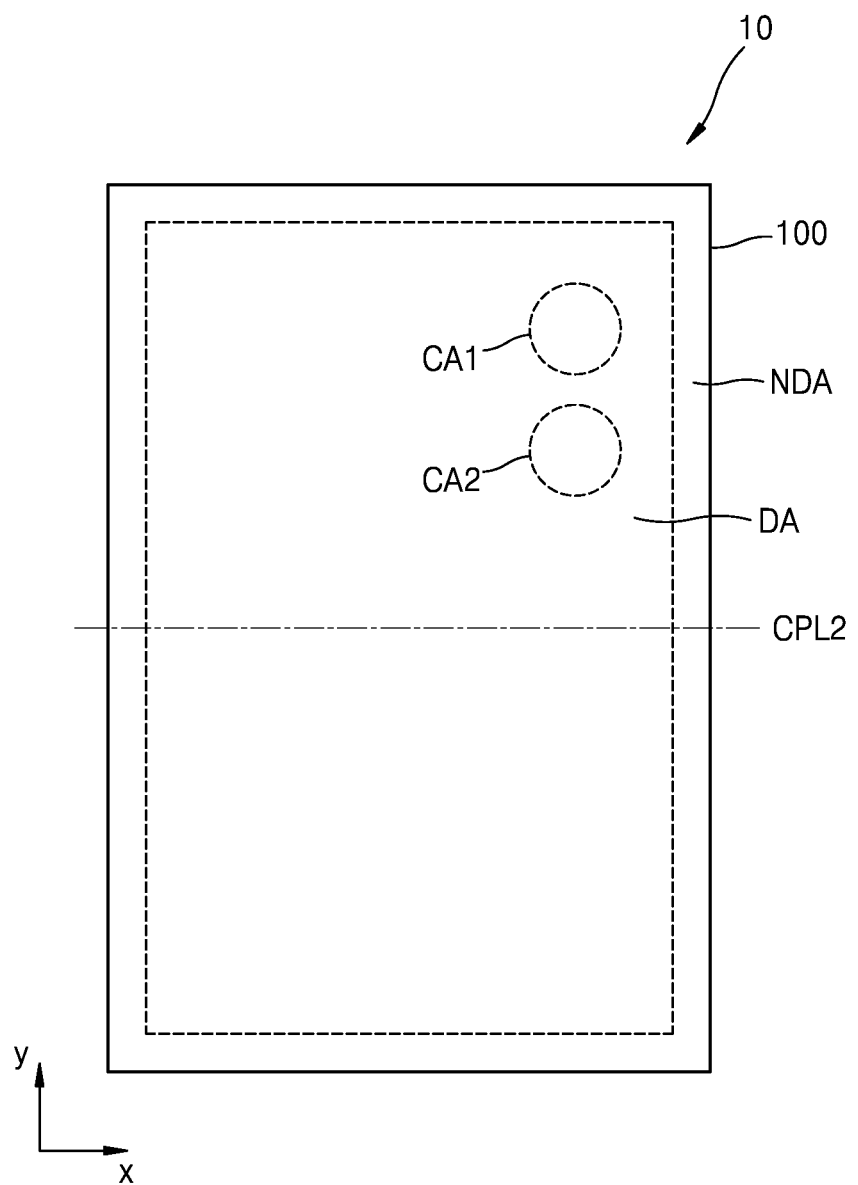
FIG. 3D is a plan view of the display panel according to an embodiment.

FIG. 3D is a plan view of the display panel 10 according to an embodiment. In FIG. 3D, the same members as those of FIG. 3C are denoted by the same reference numerals, and thus a repeated explanation will be omitted.

Referring to FIG. 3D, the display panel 10 may include the display area DA, the first component area CA1 where a first transmitting portion and a first pixel group are located, the second component area CA2 where a second transmitting portion and a second pixel group are located, and the non-display area NDA surrounding the display area DA.

In the present embodiment, the first component area CA1 and the second component area CA2 may be located adjacent to each other. In FIG. 3D, the first component area CA1 and the second component area CA2 are arranged in the second direction (y-direction).

In the present embodiment, the first component area CA1 and the second component area CA2 may be located to correspond to an edge portion of the substrate 100. Although the first component area CA1 and the second component area CA2 are located on an upper right portion of the substrate 100 in FIG. 3D, the first component area CA1 and the second component area CA2 may be located on a lower right portion, an upper left portion, or a lower left portion.

FIG. 4 is a plan view illustrating a part of a display panel according to an embodiment.

Referring to FIG. 4, the display panel may include the display area DA where the main pixel group PGm is located, the first component area CA1 where the first transmitting portion TA1 and the first pixel group PG1 are located, and the second component area CA2 where the second transmitting portion TA2 and the second pixel group PG2 are located. In an embodiment, the display area DA, the first component area CA1, and the second component area CA2 may be defined in a substrate of the display panel 10. That is, the substrate may include the display area DA, the first component area CA1, and the second component area CA2. In this case, the first component area CA1 and the second component area CA2 may be located adjacent to each other. Also, the display area DA may at least partially surround at least one of the first component area CA1 and the second component area CA2.

In the present embodiment, a plurality of first transmitting portion TA1 may be located in the first component area CA1.

Furthermore, a plurality of first pixel groups PG1 may be located in the first component area CA1. In an embodiment, the plurality of first transmitting portions TA1 and the plurality of first pixel groups PG1 may be arranged in the first direction (x-direction) or the second direction (y-direction) according to a preset first arrangement order.

In the present embodiment, a plurality of second transmitting portions TA2 may be located in the second component area CA2. Furthermore, a plurality of second pixel groups PG2 may be located in the second component area CA2. In an embodiment, the plurality of second transmitting portions TA2 and the plurality of second pixel groups PG2 may be arranged in the first direction (x-direction) or the second direction (y-direction) according to a preset second arrangement order. In this case, the second arrangement order of the plurality of second transmitting portions TA2 and the plurality of second pixel groups PG2 may be different from the first arrangement order of the plurality of first transmitting portions TA1 and the plurality of first pixel groups PG1. For example, the second transmitting portion TA2 may be located in the second component area CA2 at a position corresponding to a position of the first pixel group PG1 in the first component area CA1. Furthermore, the first transmitting portion TA1 may be located in the first component area CA1 at a position corresponding to a position of the second pixel group PG2 in the second component area CA2.

In the present embodiment, one of the first pixel groups PG1 may be spaced apart by a first distance d1 in the first direction (x-direction) from a first center CT1 of the first component area CA1. In this case, when the first pixel group PG1 is spaced apart by the first distance d1, it means that the center of the first pixel group PG1 is spaced apart by the first distance d1 in the first direction (x-direction) from the first center CT1. Furthermore, one of the plurality of first pixel groups PG1 may be spaced apart by a second distance d2 in the second direction (y-direction) intersecting the first direction from the first center CT1. In this case, when the first pixel group PG1 is spaced apart by the second distance d2, it means that the center of the first pixel group PG1 is spaced apart by the second distance d2 in the second direction (y-direction) from the first center CT1.

In this case, one of the second transmitting portions TA2 may be spaced apart by the first distance d1 in the first direction (x-direction) from a second center CT2 of the second component area CA2. In this case, when the second transmitting portion TA2 is spaced apart by the first distance d1, it means that the center of the second transmitting portion TA2 is spaced apart by the first distance d1 in the first direction (x-direction) from the second center CT2. Furthermore, one of the second transmitting portions TA2 may be spaced apart by the second distance d2 in the second direction (y-direction) from the second center CT2. In this case, when the second transmitting portion TA2 is spaced apart by the second distance d2, it means that the center of the second transmitting portion TA2 is spaced apart by the second distance d2 in the second direction (y-direction) from the second center CT2. Accordingly, the second transmitting portion TA2 may be located in the second component area CA2 at a position corresponding to a position of the first pixel group PG1 in the first component area CA1.

In the present embodiment, one of the second pixel groups PG2 may be spaced apart by a third distance d3 in the first direction (x-direction) from the second center CT2. In this case, when the second pixel group PG2 is spaced apart by the third distance d3, it means that the center of the second pixel group PG2 is spaced apart by the third distance d3 in the first direction (x-direction) from the second center CT2. Furthermore, one of the second pixel groups PG2 may be spaced apart by a fourth distance d4 in the second direction (y-direction) from the second center CT2. In this case, when the second pixel group PG2 is spaced apart by the fourth distance d4, it means that the center of the second pixel group PG2 is spaced apart by the fourth distance d4 in the second direction (y-direction) from the second center CT2.

In this case, one of the first transmitting portions TA1 may be spaced apart by the third distance d3 in the first direction (x-direction) from the first center CT1. In this case, when the first transmitting portion TA1 is spaced by the third distance d3, it means that the center of the first transmitting portion TA1 is spaced apart by the third distance d3 in the first direction (x-direction) from the first center CT1. Furthermore, one of the first transmitting portions TA1 may be spaced apart by the fourth distance d4 in the second direction (y-direction) from the first center CT1. In this case, when the first transmitting portion TA1 is spaced apart by the fourth distance d4, it means that the center of the first transmitting portion TA1 is spaced apart by the fourth distance d4 in the second direction (y-direction) from the first center CT1. Accordingly, the first transmitting portion TA1 may be located in the first component area CA1 at a position corresponding to a position of the second pixel group PG2 in the second component area CA2.

In another aspect, one of the first pixel groups PG1 may be spaced apart by a first interval g1 in the first direction (x-direction) from the first center CT1. In this case, when the first pixel group PG1 is spaced apart by the first interval g1, it means that the center of the first pixel group PG1 is spaced apart by the first interval g1 in the first direction (x-direction) from the first center CT1.

One of the first pixel groups PG1 may be spaced apart by a second interval g2 in the second direction (y-direction) from the first center CT1. In this case, when the first pixel group PG1 is spaced by the second interval g2, it means that the center of the first pixel group PG1 is spaced apart by the second interval g2 in the second direction (y-direction) from the first center CT1.

One of the second pixel groups PG2 may be spaced apart by a third interval g3 in the first direction (x-direction) from the second center CT2. In this case, when the second pixel group PG2 is spaced apart by the third interval g3, it means that the center of the second pixel group PG2 is spaced apart by the third interval g3 in the first direction (x-direction) from the second center CT2.

One of the second pixel groups PG2 may be spaced apart by a fourth interval g4 in the second direction (y-direction) from the second center CT2. In this case, when the second pixel group PG2 is spaced apart by the fourth interval g4, it means that the center of the second pixel group PG2 is spaced by the fourth interval g4 in the second direction (y-direction) from the second center CT2.

In the present embodiment, a difference between the first interval g1 and the third interval g3 may be a distance between the center of the first transmitting portion TA1 and the center of the first pixel group PG1 adjacent to each other in the first direction (x-direction). In another embodiment, a difference between the second interval g2 and the fourth interval g4 may be a distance between the center of the first transmitting portion TA1 and the center of the first pixel group PG1 adjacent to each other in the second direction (y-direction). Accordingly, a position of the first pixel group PG1 away from the first center CT1 may be different from a position of the second pixel group PG2 away from the second center CT2.

One of the first transmitting portions TA1 may be spaced apart by a fifth interval g5 in the first direction (x-direction) from the first center CT1. In this case, when the fifth interval transmitting portion TA1 is spaced apart by the fifth interval g5, it means that the center of the first transmitting portion TA1 is spaced apart by the fifth interval g5 in the first direction (x-direction) from the first center CT1.

One of the first transmitting portions TA1 may be spaced apart by a sixth interval g6 in the second direction (y-direction) from the first center CT1. In this case, when the first transmitting portion TA1 is spaced apart by the sixth interval g6, it means that the center of the first transmitting portion TA1 is spaced apart by the sixth interval g6 in the second direction (y-direction) from the first center CT1.

One of the second transmitting portions TA2 may be spaced apart by a seventh interval g7 in the first direction (x-direction) from the second center CT2. In this case, when the second transmitting portion TA2 is spaced apart by the seventh interval g7, it means that the center of the second transmitting portion TA2 is spaced apart by the seventh interval g7 in the first direction (x-direction) from the second center CT2.

One of the second transmitting portions TA2 may be spaced apart by an eighth interval g8 in the second direction (y-direction) from the second center CT2. In this case, when the second transmitting portion TA2 is spaced by the eighth interval g8, it means that the center of the second transmitting portion TA2 is spaced apart by the eighth interval g8 in the second direction (y-direction) from the second center CT2.

In the present embodiment, a difference between the fifth interval g5 and the seventh interval g7 may be a distance between the center of the first transmitting portion TA1 and the center of the first pixel group PG1 adjacent to each other in the first direction (x-direction). In another embodiment, a difference between the sixth interval g6 and the eighth interval g8 may be a distance between the center of the first transmitting portion TA1 and the center of the first pixel group PG1 adjacent to each other in the second direction (y-direction). Accordingly, a position of the first transmitting portion TA1 away from the first center CT1 may be different from a position of the second transmitting portion TA2 away from the second center CT2.

The first transmitting portion TA1, the first pixel group PG1, the second transmitting portion TA2, and the second pixel group PG2 may be located to maintain resolutions of the first component area CA1 and the second component area CA2 and increase transmittances of the first component area CA1 and the second component area CA2.

A visible light transmittance at positions of the first pixel group PG1 and the second pixel group PG2 may be low. In this case, the second transmitting portion TA2 having a high visible light transmittance may be located in the second component area CA2 at a position corresponding to a position of the first pixel group PG1 in the first component area CA1. Also, the first transmitting portion TA1 having a high visible light transmittance may be located in the first component area CA1 at a position corresponding to a position of the second pixel group PG2 in the second component area CA2. That is, the first transmitting portion TA1 of the first component area CA1 and the second transmitting portion TA2 of the second component area CA2 may be located at complementary positions. Accordingly, images obtained by a first component located under the first component area CA1 and a second component located under the second component area CA2 may be compensated for each other, thereby maintaining high image quality. Furthermore, in this case, an area occupied by the first pixel group PG1 in the first component area CA1 per unit area and an area occupied by the second pixel group PG2 in the second component area CA2 per unit area do not need to be minimized to maintain a transmittance. Accordingly, resolutions of the first component area CA1 and the second component area CA2 may be maintained.

Figure 5:
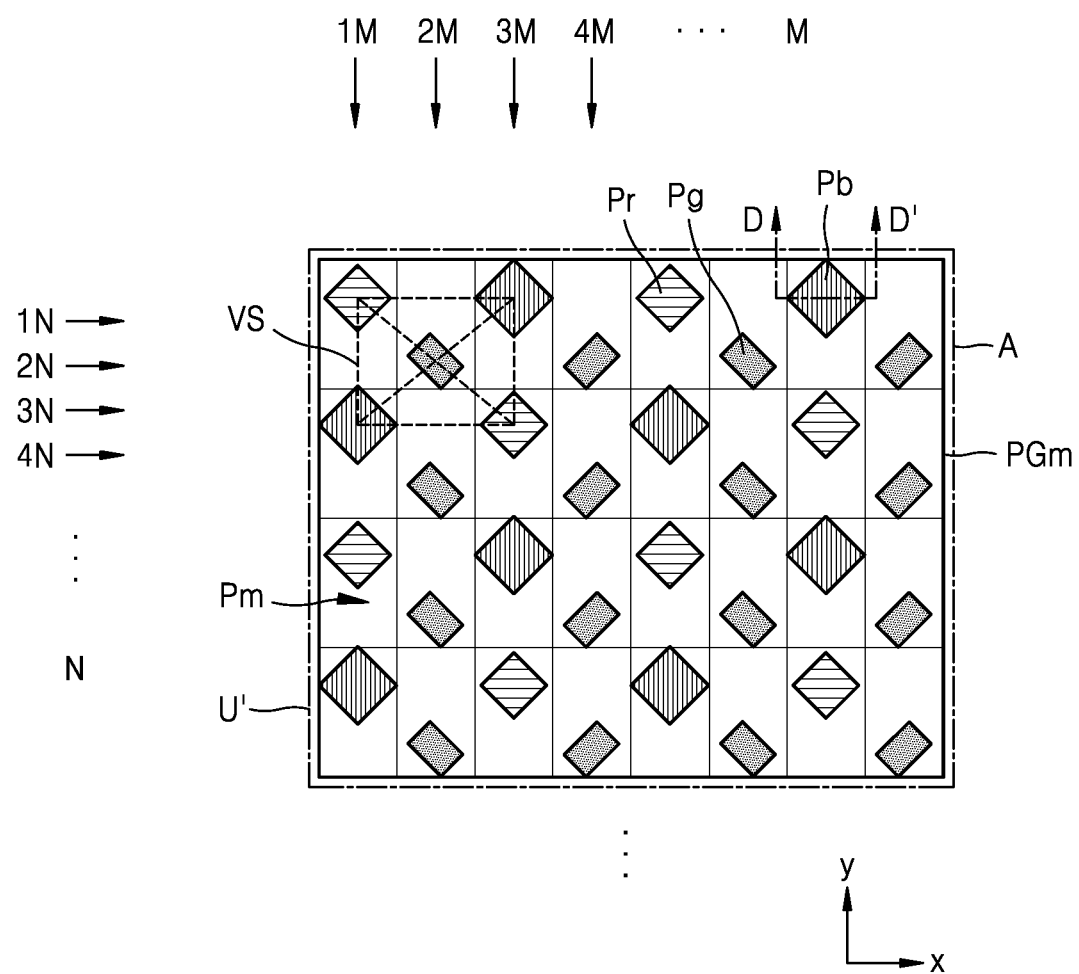
FIG. 5 is a view illustrating a pixel arrangement structure in a display area according to an embodiment.

FIG. 5 is an enlarged view of a portion A of FIG. 4, illustrating a pixel arrangement structure in a display area according to an embodiment.

Referring to FIG. 5, a plurality of main sub-pixels Pm may be located in the main pixel group PGm. Each of the main sub-pixels Pm may emit any one of red light, green light, blue light, and white light. The term 'sub-pixel' used herein refers to an emission area that is a minimum unit for forming an image. When an organic light-emitting diode is used as a display element, the emission area may be defined by an opening of a pixel-defining film, which will be described later.

As shown in FIG. 5, the main sub-pixels Pm located in the main pixel group PGm may be arranged in a pentile structure. In an embodiment, the main pixel group PGm may include a red sub-pixel Pr, a green sub-pixel Pg, and a blue sub-pixel Pb. The red sub-pixel Pr, the green sub-pixel Pg, and the blue sub-pixel Pb may respectively represent red, green, and blue colors.

A plurality of red sub-pixels Pr and a plurality of blue sub-pixels Pb may be alternately arranged in a first row 1N. A plurality of green sub-pixels Pg may be arranged at certain intervals in a second row 2N adjacent to the first row 1N. A plurality of blue sub-pixels Pb and a plurality of red sub-pixels Pr may be alternately arranged in a third row 3N adjacent to the second row 2N, and a plurality of green sub-pixels Pg may be arranged at certain intervals in a fourth row 4N adjacent to the third row 3N. The main sub-pixels Pm may be repeatedly arranged to an $N^{th}$ row. In this case, sizes of the blue sub-pixels Pb and the red sub-pixels Pr may be larger than that of the green sub-pixels Pg.

The plurality of red sub-pixels Pr and the blue sub-pixels Pb located in the first row 1N and the plurality of green sub-pixels Pg located in the second row 2N may be alternately arranged. Accordingly, a plurality of red sub-pixels Pr and a plurality of blue sub-pixels Pb may be alternately arranged in a first column 1M. A plurality of green sub-pixels Pg may be arranged at certain intervals in a second column 2M adjacent to the first column 1M. A plurality of blue sub-pixels Pb and a plurality of red sub-pixels Pr may be alternately arranged in a third column 3M adjacent to the second column 2M, and a plurality of green sub-pixels Pg may be located at certain intervals in a fourth column 4M adjacent to the third column 3M. The main sub-pixels Pm may be repeatedly arranged to an Mth column.

In other words, from among vertices of a virtual quadrangular shape VS having a center point of the green sub-pixel Pg as a center point of the virtual quadrangular shape VS, the red sub-pixels Pr may be located at first and third vertices that face each other, and the blue sub-pixels Pb may be located at second and fourth vertices that are the remaining vertices. In this case, the virtual quadrangular shape VS may be modified to any of various shapes such as a rectangular shape, a diamond shape, or a square shape.

Such a sub-pixel arrangement structure may be referred to as a pentile matrix structure or a pentile structure, and a rendering driving method that represents a color by sharing adjacent sub-pixels may be used, thereby displaying an image having a high resolution with a small number of pixels.

Although the plurality of main sub-pixels Pm are arranged in a pentile matrix structure in FIG. 5, in another embodiment, the plurality of main sub-pixels Pm may be arranged in any of various arrangement structures such as a stripe arrangement structure, a mosaic arrangement structure, or a delta arrangement structure.

Figure 6:
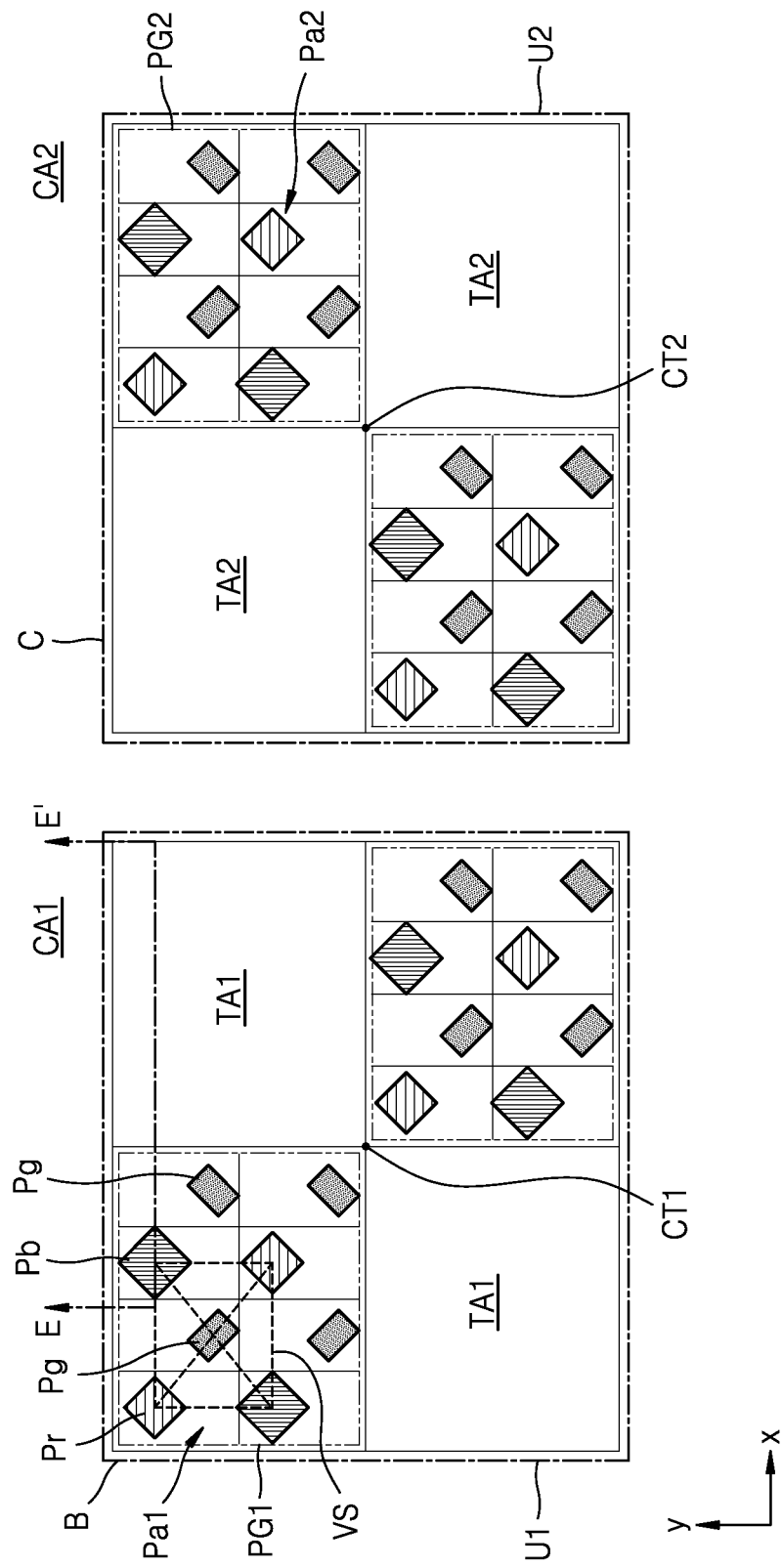
FIG. 6 is a view illustrating sub-pixel arrangement structures in a first component area and a second component area according to an embodiment.

FIG. 6 is a view illustrating sub-pixel arrangement structures in the first component area CA1 and the second component area CA2 according to an embodiment. FIG. 6 is an enlarged view of portions B and C of FIG. 4.

Referring to FIG. 6, the first transmitting portion TA1 and the first pixel group PG1 may be located in the first component area CA1. In the present embodiment, a plurality of first transmitting portions TA1 may be located in the first component area CA1. Also, a plurality of first pixel groups PG1 may be located in the first component area CA1. In an embodiment, the plurality of first transmitting portions TA1 and the plurality of first pixel groups PG1 may be arranged in the first direction (x-direction) or the second direction (y-direction) according to a preset first arrangement order.

The second transmitting portion TA2 and the second pixel group PG2 may be located in the second component area CA2. A plurality of second transmitting portions TA2 may be located in the second component area CA2. Furthermore, a plurality of second pixel group PG2 may be located in the second component area CA2. In an embodiment, the plurality of second transmitting portions TA2 and the plurality of second pixel groups PG2 may be arranged in the first direction (x-direction) or the second direction (y-direction) according to a preset second arrangement order. In this case, the second arrangement order of the plurality of second transmitting portions TA2 and the plurality of second pixel groups PG2 may be different from the first arrangement order of the plurality of first transmitting portions TA1 and the plurality of first pixel groups PG1. For example, the second transmitting portion TA2 may be located from the second center CT2 at a position corresponding to a position of the first pixel group PG1 from the first center CT1. Furthermore, the first transmitting portion TA1 may be located from the first center CT1 at a position corresponding to a position of the second pixel group PG2 from the second center CT2.

When the first pixel group PG1 including the first transmitting portion TA1 and the first auxiliary sub-pixel Pa1 is compared with the second pixel group PG2 including the second transmitting portion TA2 and the second auxiliary sub-pixel Pa2, they are substantially similar except the locations of the red sub-pixels Pr, the blue sub-pixels Pb, and the green sub-pixels Pg. Thus, the first pixel group PG1 including the first transmitting portion TA1 and the first auxiliary sub-pixel Pa1 will be described in detail, but the second pixel group PG2 including the second transmitting portion TA2 and the second auxiliary sub-pixel Pa2 will be omitted.

The first auxiliary sub-pixels Pa1 may be located in the first pixel group PG1. In an embodiment, eight first auxiliary sub-pixels Pa1 arranged in a pentile structure may be included in the first pixel group PG1. That is, two red sub-pixels Pr, four green sub-pixels Pg, and two blue sub-pixels Pb may be included in one first pixel group PG1.

In the first component area CA1, a first basic unit U1 including a certain number of first pixel groups PG1 and a certain number of first transmitting portions TA1 may be repeatedly arranged in the first direction (x-direction) and/or the second direction (y-direction). In the second component area CA2, a second basic unit U2 including a certain number of second pixel groups PG2 and a certain number of second transmitting portions TA2 may be repeatedly arranged in the first direction (x-direction) and/or the second direction (y-direction).

In FIG. 6, the first basic unit U1 may have a quadrangular shape in which two first pixel groups PG1 and two first transmitting portions TA1 around the two first pixel groups PG1 are grouped. The second basic unit U2 may have a quadrangular shape in which two second pixel groups PG2 and two second transmitting portions TA2 around the two second pixel groups PG2 are grouped. The first basic unit U1 and the second basic unit U2 are repeating shapes, but do not mean separation of elements.

Referring back to FIG. 5, a corresponding unit U' having the same area as the area of the first basic unit U1 may be configured in a display area. In this case, the number of main sub-pixels Pm included in the corresponding unit U' may be greater than the number of first auxiliary sub-pixels Pa1 included in the first basic unit U1. That is, the number of first auxiliary sub-pixels Pa1 included in the first basic unit U1 may be 16, and the number of main sub-pixels Pm included in the corresponding unit U' may be 32. Thus, in the same area, the number of main sub-pixels Pm may be twice larger thanthe number of first auxiliary sub-pixels Pa1.

As shown in FIG. 6, an arrangement structure of the first auxiliary sub-pixels Pa1 is a pentile structure, and a sub-pixel arrangement structure of the first component area CA1 whose resolution is one-half (½) of that of the display area is a ½ pentile structure. The number or an arrangement method of the first auxiliary sub-pixels Pa1 and the second auxiliary sub-pixels Pa2 respectively included in the first pixel group PG1 and the second pixel group PG2 may be modified and designed according to resolutions of the first component area CA1 and the second component area CA2.

Figure 7A:
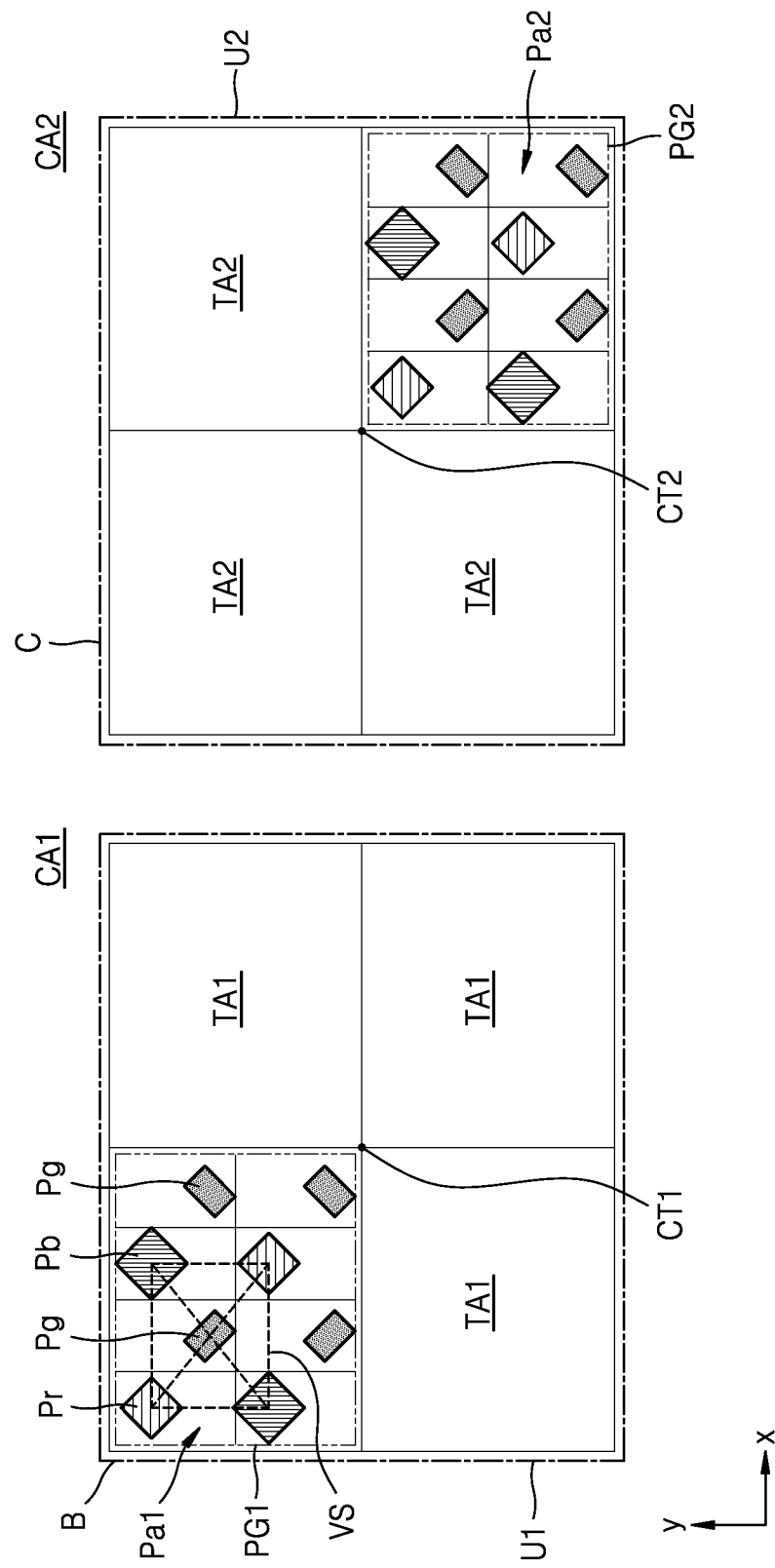
FIGS. 7A, 7B, and 7C are views illustrating sub-pixel arrangement structures in the first component area and the second component area according to another embodiment.
Figure 7B:
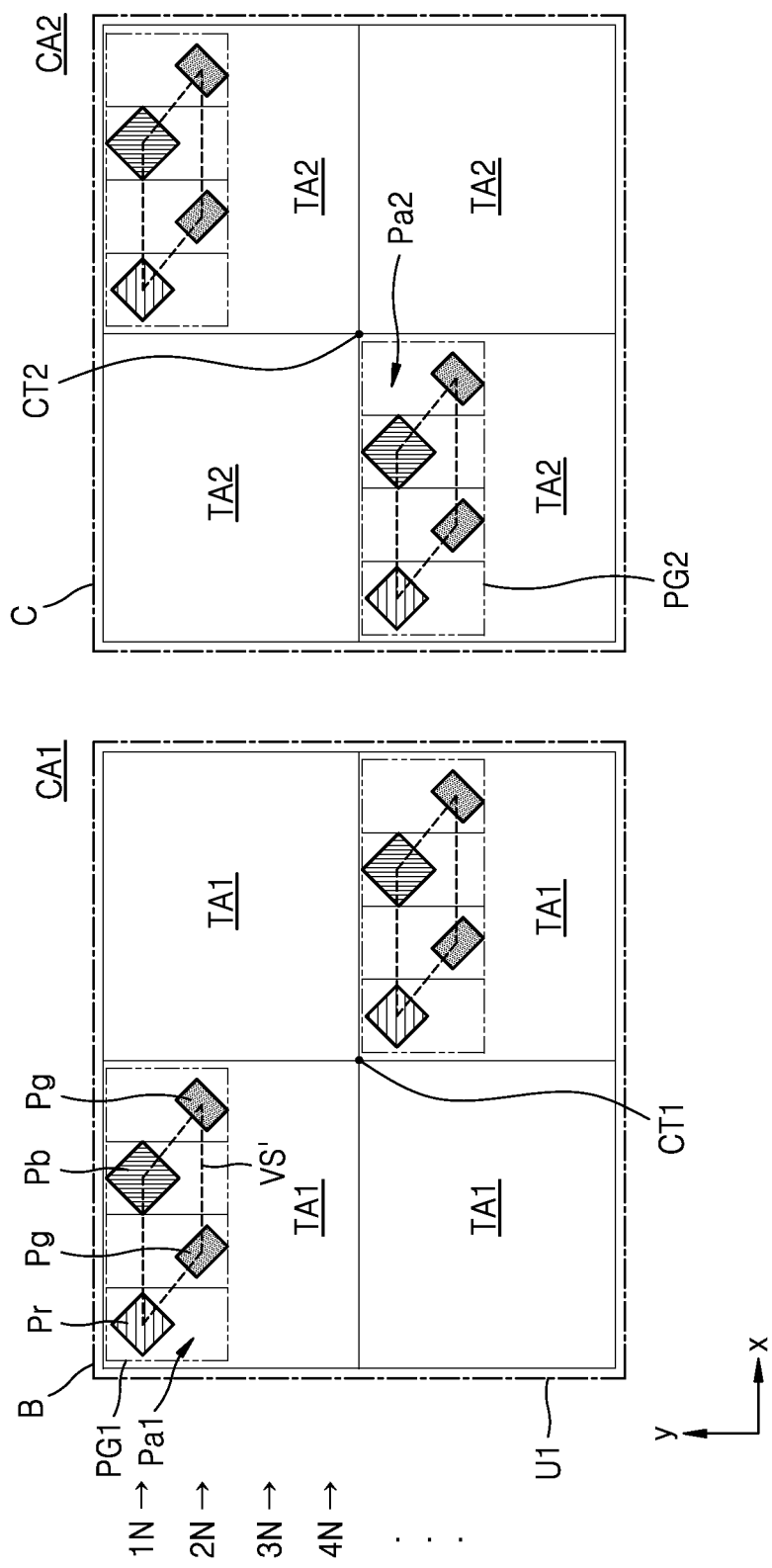
Figure 7C:
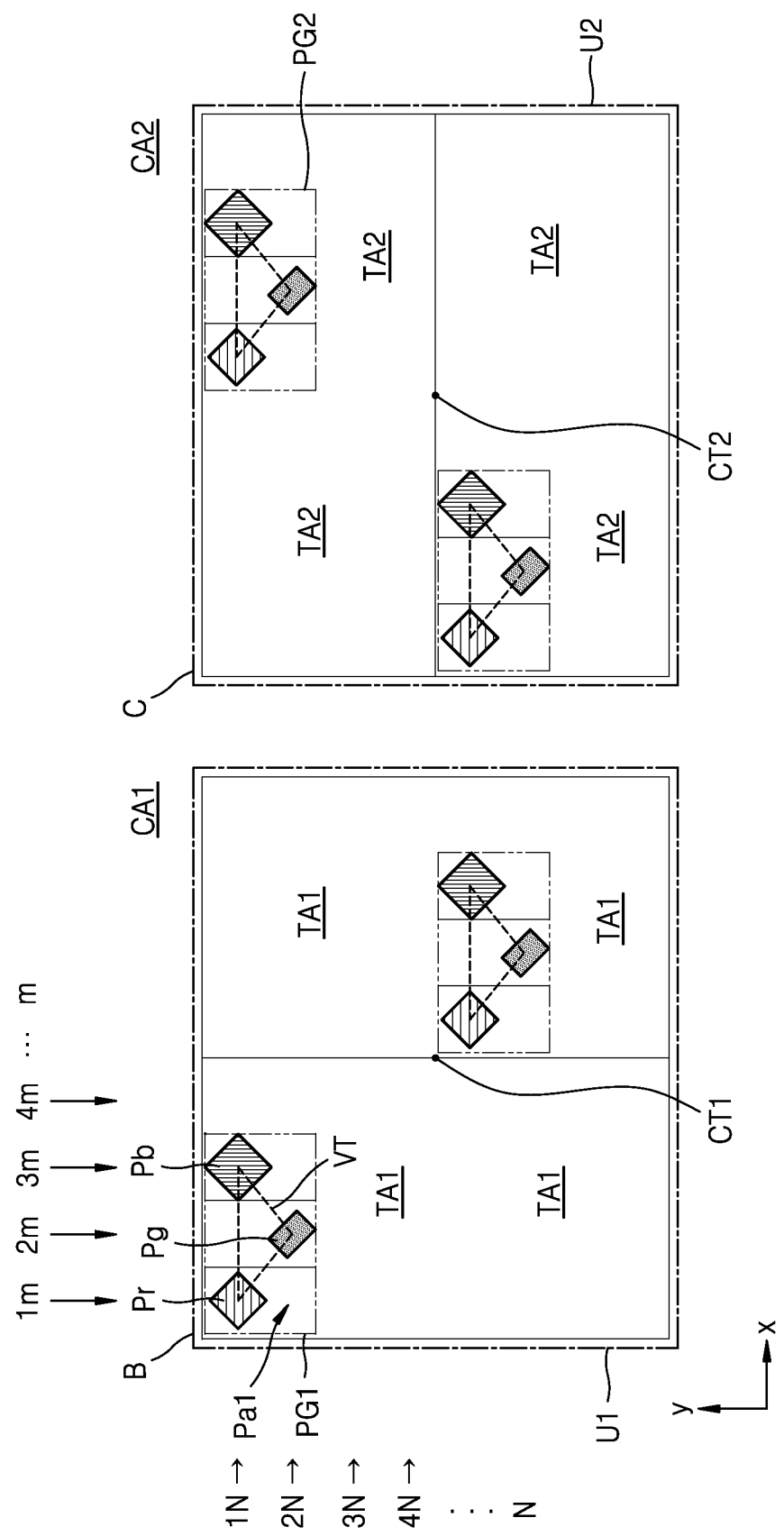

FIGS. 7A, 7B, and 7C are views illustrating sub-pixel arrangement structures in the first component area CA1 and the second component area CA2 according to another embodiment. In FIGS. 7A, 7B, and 7C, the same members as those of FIG. 6 are denoted by the same reference numerals, and thus a repeated explanation will be omitted.

Referring to FIG. 7A, a sub-pixel arrangement structure of the first component area CA1 may be a ¼ pentile structure. Although eight first auxiliary sub-pixels Pa1 are arranged in a pentile structure in the first pixel group PG1 in the present embodiment, only one pixel group PG1 may be included in the first basic unit U1. The first transmitting portion TA1 may be included in a remaining portion of the first basic unit U1. Accordingly, in the same area, the number of main sub-pixels Pm included in the corresponding unit U' of FIG. 5 may be four times larger than the number of first auxiliary sub-pixels Pa1. In this case, one first pixel group PG1 may be surrounded by the first transmitting portions TA1.

In the present embodiment, a sub-pixel arrangement structure of the second component area CA2 is similar to the sub-pixel arrangement structure of the first component area CA1. Thus, a detailed explanation will be omitted.

Referring to FIG. 7B, a sub-pixel arrangement structure of the first component area CA1 may be a ¼ pentile distribution structure. In the present embodiment, two first pixel groups PG1 may be distributed in the first basic unit U1. A total of four first auxiliary sub-pixels Pa1 including one red sub-pixel Pr, two green sub-pixels Pg, and one blue sub-pixel Pb may be included in one first pixel group PG1 based on a pentile structure.

The first component area CA1 may have a sub-pixel arrangement structure in which the four first sub-pixels Pa1 are respectively located at vertices of a virtual quadrangular shape VS'. In an embodiment, the virtual quadrangular shape VS' may be a parallelogram. In this case, the red sub-pixel Pr and the blue sub-pixel Pb may be arranged in a first row 1N, and two green sub-pixels Pg may be arranged in a second row 2N.

In the sub-pixel arrangement structure of the present embodiment, sub-pixels are not arranged in a third row 3N and a fourth row 4N. Accordingly, the first auxiliary sub-pixels Pa1 may be distributed in the first basic unit U1.

In the present embodiment, a sub-pixel arrangement structure of the second component area CA2 is similar to the sub-pixel arrangement structure of the first component area CA1. Thus, a detailed explanation will be omitted.

Referring to FIG. 7C, a sub-pixel arrangement structure of the first component area CA1 may be a 3/16 pentile structure. In the present embodiment, two first pixel groups PG1 may be distributed in the first basic unit U1. One red sub-pixel Pr, one green sub-pixel Pg, and one blue sub-pixel Pb may be included in one first pixel group PG1 based on a pentile structure. That is, three first auxiliary sub-pixels Pa1 may be included in one first pixel group PG1. Regarding an arrangement of the first auxiliary sub-pixels Pa1 included in one first pixel group PG1, center points of the red sub-pixel Pr, the green sub-pixel Pg, and the blue sub-pixel Pb may be respectively located at vertices of a virtual triangular shape VT.

In the sub-pixel arrangement structure of the present embodiment, sub-pixels are not arranged in a third row 3N and a fourth row 4N, and sub-pixels are not arranged in a fourth column 4M. Accordingly, the number of first auxiliary sub-pixels Pa1 included in the first basic unit U1 may be 6 and the number of main sub-pixels Pm included in the corresponding unit U' of FIG. 5 may be 32. Thus, in the same area, a ratio between the number of first auxiliary sub-pixels Pa1 and the number of main sub-pixels Pm may be 3:16.

In the present embodiment, a sub-pixel arrangement structure of the second component area CA2 is similar to the sub-pixel arrangement structure of the first component area CA1, and thus a detailed explanation will be omitted.

Figure 8A:
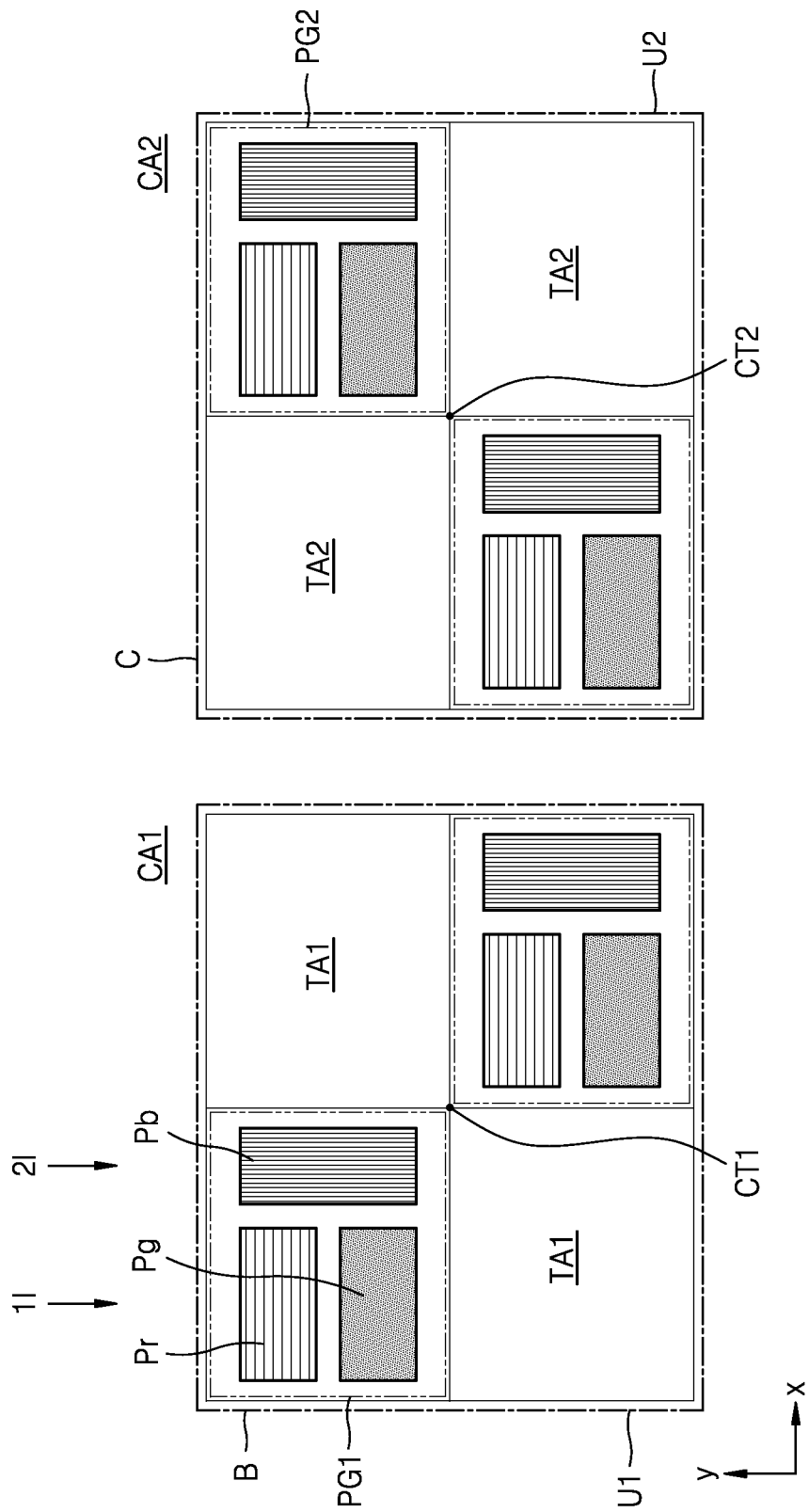
FIGS. 8A and 8B are views illustrating sub-pixel arrangement structures in the first component area and the second component area according to another embodiment.
Figure 8B:
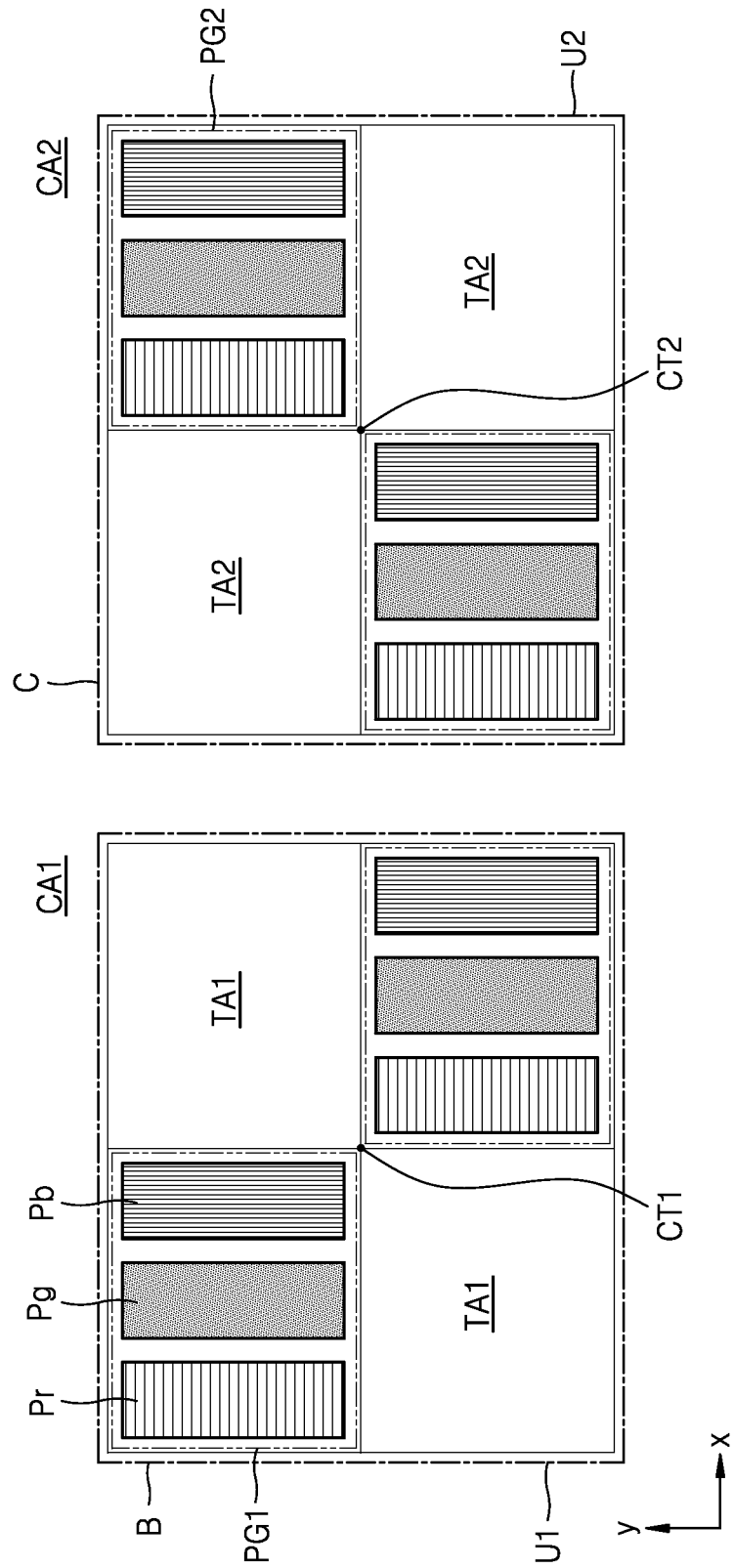

FIGS. 8A and 8B are views illustrating sub-pixel arrangement structures in the first component area CA1 and the second component area CA2 according to another embodiment. In FIGS. 8A and 8B, the same members as those of FIG. 6 are denoted by the same reference numerals, and thus a repeated explanation will be omitted.

Referring to FIG. 8A, a sub-pixel arrangement structure of the first component area CA1 may be an S-stripe structure. In the present embodiment, the first auxiliary sub-pixels Pa1 included in one first pixel group PG1 may include one red sub-pixel Pr, one green sub-pixel Pg, and one blue sub-pixel Pb.

In the present embodiment, the red sub-pixel Pr and the green sub-pixel Pg may be alternately located in a first column 11, and the blue sub-pixel Pb may be located in a second column 21 adjacent to the first column 11. In this case, the red sub-pixel Pr and the green sub-pixel Pg may be located in a quadrangular shape having a long side in the first direction (x-direction), and the blue sub-pixel Pb may be located in a quadrangular shape having a long side in the second direction (y-direction). In other words, a bottom long side of the red sub-pixel Pr and a top long side of the green sub-pixel Pg may face each other, and one of the short sides of the red sub-pixel Pr and one of the short sides of the green sub-pixel Pg may face one of the long sides of the blue sub-pixel Pb.

A length of one of the long sides of the blue sub-pixel Pb in the second direction (y-direction) may be equal to or greater than a sum of a length of one of the short sides of the red sub-pixel Pr in the second direction (y-direction) and a length of one of the short sides of the green sub-pixel Pg in the second direction (y-direction). Furthermore, a length of the one of the long sides of the red sub-pixel Pr and a length of the one of the long sides of the green sub-pixel Pg in the first direction (x-direction) are longer than a length of the one of the short sides of the blue sub-pixel Pb in the first direction (x-direction).

In the present embodiment, an area occupied by one first pixel group PG1 in the first basic unit U1 may be about ¼ of that of the first basic unit U1. Although only two first pixel groups PG1 are included in the first basic unit U1 in FIG. 8A, in another embodiment, one first pixel group PG1 or three or more first pixel groups PG1 may be included in the first basic unit U1. Furthermore, the areas of the first auxiliary sub-pixels Pa1 included in the first pixel group PG1 may be modified in various ways.

In the present embodiment, a sub-pixel arrangement structure of the second component area CA2 is similar to the sub-pixel arrangement structure of the first component area CA1. Thus, a detailed explanation will be omitted.

Referring to FIG. 8B, a sub-pixel arrangement structure of the first component area CA1 may be a stripe structure. That is, the red sub-pixel Pr, the green sub-pixel Pg, and the blue sub-pixel Pb may be located in parallel in the first direction (x-direction). In this case, the red sub-pixel Pr, the green sub-pixel Pg, and the blue sub-pixel Pb may have long sides in the second direction (y-direction) and may have short sides on the first direction (x-direction).

Alternatively, although it is not shown, the red sub-pixel Pr, the green sub-pixel Pg, and the blue sub-pixel Pb may be located in parallel in the second direction (y-direction). In this case, the red sub-pixel Pr, the green sub-pixel Pg, and the blue sub-pixel Pb may have long sides in the first direction (x-direction) and may have short sides in the second direction (y-direction).

In the present embodiment, a sub-pixel arrangement structure of the second component area CA2 is similar to the sub-pixel arrangement structure of the first component area CA1. Thus, a detailed explanation will be omitted.

Figure 9:
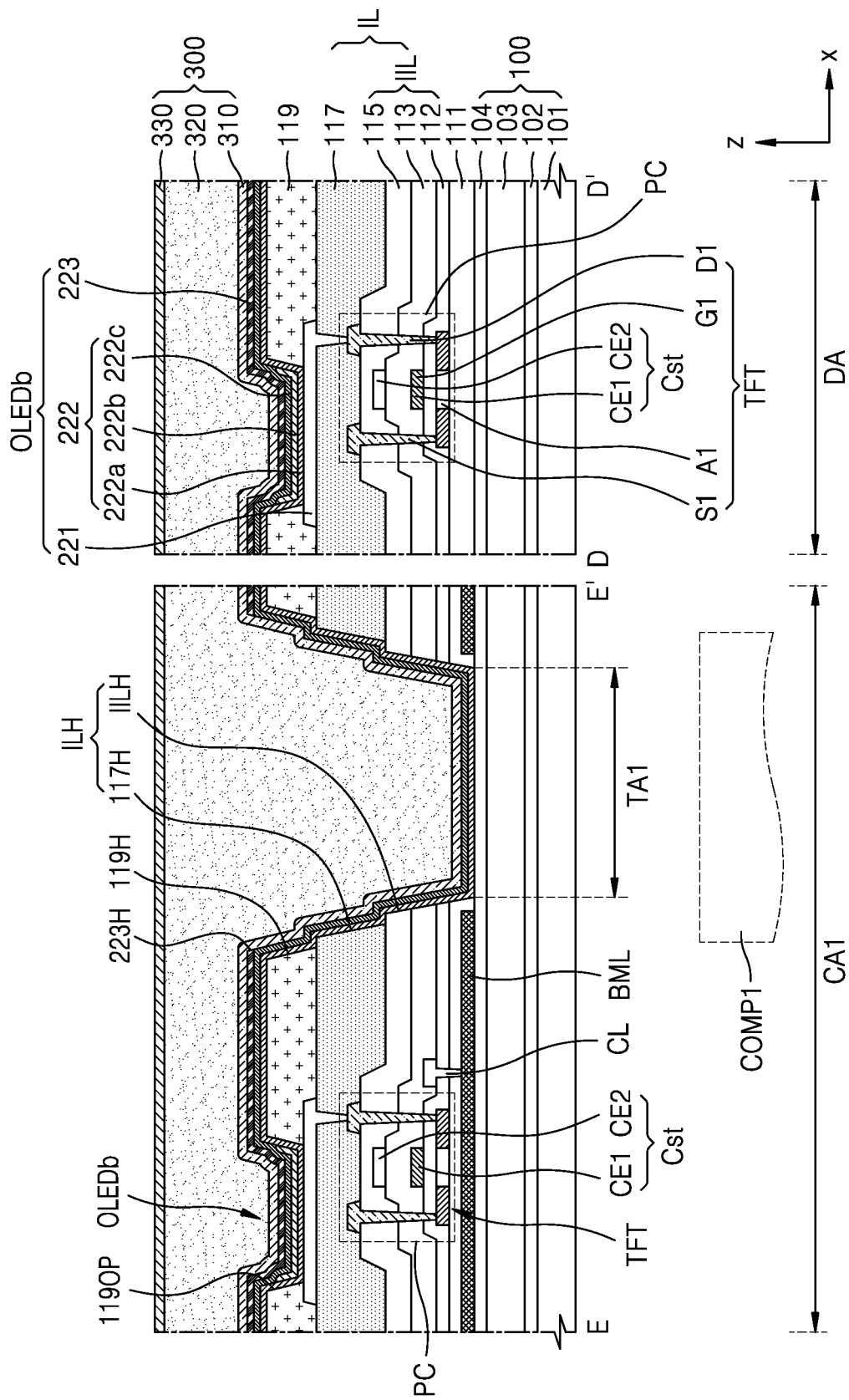
FIG. 9 is a cross-sectional view illustrating a part of a display panel according to an embodiment.

FIG. 9 is a cross-sectional view illustrating a part of a display panel, taken along line D-D' of FIG. 5 and line E-E' of FIG. 6 according to an embodiment.

Referring to FIG. 9, the display panel may include the substrate 100, the buffer layer 111, the insulating layer IL, a blue organic light-emitting diode OLEDb that is a display element, and the encapsulation layer 300. The insulating layer IL may include an inorganic insulating layer IL and a planarization layer 117.

In an embodiment, the substrate 100 may include a base layer including a polymer resin and a barrier layer including an inorganic insulating material. For example, the substrate 100 may include a first base layer 101, a first barrier layer 102, a second base layer 103, and a second barrier layer 104, which are sequentially stacked. Each of the first base layer 101 and the second base layer 103 may include polyethersulfone, polyacrylate, polyetherimide, polyethylene naphthalate, polyethylene terephthalate, polyphenylene sulfide, polyarylate, polyimide, polycarbonate, or cellulose acetate propionate. Each of the first barrier layer 102 and the second barrier layer 104 may include an inorganic insulating layer such as silicon oxide, silicon oxynitride, and/or silicon nitride. In another embodiment, the substrate 100 may include glass.

The buffer layer 111 may be located on the substrate 100. The buffer layer 111 may reduce or prevent penetration of a foreign material, moisture, or external air from the bottom of the substrate 100. The buffer layer 111 may include an inorganic material such as oxide or nitride, an organic material, or a combination of an organic material and an inorganic material, and may have a single or multi-layer structure including an inorganic material and an organic material.

A pixel circuit PC including a thin-film transistor TFT and a storage capacitor Cst may be located on the buffer layer 111. The thin-film transistor TFT may include a semiconductor layer A1, a gate electrode G1 overlapping a channel region of the semiconductor layer A1, and a source electrode S1 and a drain electrode D1 respectively connected to a source region and a drain region of the semiconductor layer A1. A gate insulating layer 112 may be located between the semiconductor layer A1 and the gate electrode G1, and a first interlayer insulating layer 113 and a second interlayer insulating layer 115 may be located between the gate electrode G1 and the source electrode S1 or between the gate electrode G1 and the drain electrode D1.

The storage capacitor Cst may overlap the thin-film transistor TFT. The storage capacitor Cst may include a first capacitor plate CE1 and a second capacitor plate CE2 overlapping each other. In some embodiments, the gate electrode G1 of the thin-film transistor TFT may include the first capacitor plate CE1 of the storage capacitor Cst. The first interlayer insulating layer 113 may be located between the first capacitor plate CE1 and the second capacitor plate CE2.

The semiconductor layer A1 may include polysilicon. In some embodiments, the semiconductor layer A1 may include amorphous silicon. In some embodiments, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include the channel region, and the source region and the drain region doped with impurities.

The gate insulating layer 112 may include an inorganic insulating material such as silicon oxide, silicon oxynitride, or silicon nitride, and may have a single or multi-layer structure including the above material.

The gate electrode G1 or the first capacitor plate CE1 may include a low-resistance conductive material such as molybdenum (Mo), aluminum (Al), copper (Cu), and/or titanium (Ti), and may have a single or multi-layer structure including the above material.

The first interlayer insulating layer 113 may include an inorganic insulating material such as silicon oxide, silicon oxynitride, or silicon nitride, and may have a single or multi-layer structure including the above material.

The second capacitor plate CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The second interlayer insulating layer 115 may include an inorganic insulating material such as silicon oxide, silicon oxynitride, or silicon nitride, and may have a single or multi-layer structure including the above material.

The source electrode S1 or the drain electrode D1 may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W), and/or copper (Cu), and may have a single or multi-layer structure including the above material. For example, the source electrode S1 or the drain electrode D1 may have a three-layer structure including a titanium layer, an aluminum layer, and a titanium layer.

The planarization layer 117 may include a material different from that of at least one of the gate insulating layer 112, the first interlayer insulating layer 113, and/or the second interlayer insulating layer 115. The planarization layer 117 disposed on the second interlayer insulating layer 115may include an organic insulating material. The planarization layer 117 may include an organic insulating material such as acryl, benzocyclobutene (BCB), polyimide, or hexamethyldisiloxane (HMDSO).

A pixel electrode 221 may be located on the planarization layer 117. The pixel electrode 221 may be electrically connected to the thin-film transistor TFT through a contact hole formed in the planarization layer 117.

The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 221 may include a reflective film including the above material, and a transparent conductive film located over and/or under the reflective film. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may have a three-layer structure including an ITO layer, an Ag layer, and an ITO layer that are sequentially stacked.

A pixel-defining film 119 may be located on the pixel electrode 221. The pixel-defining film 119 may cover an edge portion of the pixel electrode 221. An opening portion 119OP may be defined in the pixel-defining film 119 and overlapping a central portion of the pixel electrode 221. The pixel-defining film 119 may include an organic insulating material and/or an inorganic insulating material. The opening portion 119OP may define an emission area of light emitted by the blue organic light-emitting diode OLEDb. The emission area of the light of the disclosure refers to a size of a sub-pixel.

An intermediate layer 222 includes an emission layer 222b overlapping the pixel electrode 221. The emission layer 222b may include an organic material. The emission layer 222b may include a high molecular weight organic material or a low molecular weight organic material emitting light of a certain color. The emission layer 222b may be formed by using a deposition process using a mask as described above.

A first functional layer 222a and a second functional layer 222c may be respectively located under and over the emission layer 222b.

The first functional layer 222a may have a single or multi-layer structure. For example, when the first functional layer 222a is formed of a high molecular weight material, the first functional layer 222a may include a hole transport layer (HTL) having a single-layer structure and may be formed of poly-(3,4)-ethylene-dihydroxythiophene (PEDOT) or polyaniline. When the first functional layer 222a is formed of a low molecular weight material, the first functional layer 222a may include a hole injection layer (HIL) and a hole transport layer (HTL).

The second functional layer 222c may be optional. For example, when each of the first functional layer 222a and the emission layer 222b is formed of a high molecular weight material, it may be preferable to form the second functional layer 222c. The second functional layer 222c may have a single or multi-layer structure. The second functional layer 222c may include an electron transport layer (ETL) and/or an electron injection layer (EIL).

Each of the first functional layer 222a and the second functional layer 222c may be integrally formed to entirely cover the display area DA and the first component area CA1.

A counter electrode 223 may be formed of a conductive material having a relatively low work function. For example, the counter electrode 223 may include a semi-transparent layer including silver (Ag), magnesium (Mg), aluminum (Al), nickel (Ni), chromium (Cr), lithium (Li), calcium (Ca), or an alloy thereof. Alternatively, the counter electrode 223 may further include a layer formed of ITO, IZO, ZnO, or $In_2O_3$ on the semi-transparent layer including the above material. In an embodiment, the counter electrode 223 may include silver (Ag) and magnesium (Mg).

A stacked structure in which the pixel electrode 221, the intermediate layer 222, and the counter electrode 223 are sequentially stacked may include a light-emitting diode, e.g., the blue organic light-emitting diode OLEDb. The blue organic light-emitting diode OLEDb may be covered by the encapsulation layer 300.

The encapsulation layer 300 may include the first inorganic encapsulation layer 310, the second inorganic encapsulation layer 330, and the organic encapsulation layer 320 disposed between the first inorganic encapsulation layer 310 and the second inorganic encapsulation layer 330.

Each of the first inorganic encapsulation layer 310 and the second inorganic encapsulation layer 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first inorganic encapsulation layer 310 and the second inorganic encapsulation layer 330 may be formed by using chemical vapor deposition.

The organic encapsulation layer 320 may include a polymer-based material. Examples of the polymer-based material may include an acrylic resin, an epoxy resin, polyimide, and polyethylene. For example, the organic encapsulation layer 320 may include an acrylic resin such as polymethyl methacrylate or polyacrylic acid. The organic encapsulation layer 320 may be formed by curing a monomer or applying a polymer.

The first component COMP1 may be located under the substrate 100. In particular, the first component COMP1 may be located to correspond to the first transmitting portion TA1.

The lower metal layer BML may be located between the substrate 100 and the buffer layer 111. The lower metal layer BML may be located under the thin-film transistor TFT, and may prevent degradation of the characteristics of the thin-film transistor TFT due to light emitted from the first component COMP1 or the like.

Furthermore, the lower metal layer BML may be connected through a contact hole to a wiring CL located on another layer. The lower metal layer BML may receive a constant voltage or a signal from the wiring CL. For example, the lower metal layer BML may receive a driving voltage or a scan signal. As the lower metal layer BML receives a constant voltage or a signal, the risk of electrostatic discharge may be significantly reduced. The lower electrode layer BML may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W), and/or copper (Cu). The lower metal layer BML may have a single or multi-layer structure including the above material.

In an embodiment, a transmission hole ILH may be defined in the insulating layer IL. The transmission hole ILH may include a first hole IILH of the inorganic insulating layer IIL and a second hole 117H of the planarization layer 117. Furthermore, a third hole 119H may be defined in the pixel-defining film 119. The first hole IILH, the second hole 117H, and the third hole 119H may overlap one another in the first transmitting portion TA1. The counter electrode 223 may have a fourth hole 223H located in the first transmitting portion TA1, and the fourth hole 223H may overlap the first hole IILH, the second hole 117H, and the third hole 119H. In some embodiments, the insulating layer IL may include a groove, instead of the transmission hole ILH. In this case, the planarization layer 117 may have the second hole 117H of the planarization layer 117, the pixel-defining film 119 may have the third hole 119H of the pixel-defining film 119, and the inorganic insulating layer IIL may not have the first hole IILH. In another embodiment, the insulating layer IL may not include the transmission hole ILH and the groove.

Some layers of the intermediate layer 222 of the blue organic light-emitting diode OLEDb, e.g., the first functional layer 222a and/or the second functional layer 222c, may be integrally formed to cover the first transmitting portion TA1. Alternatively, a hole corresponding to the first transmitting portion TA1, like the counter electrode 223, may be defined in the first functional layer 222a and/or the second functional layer 222c.

The encapsulation layer 300 may entirely cover the display area DA and the first component area CA1. Accordingly, the first inorganic encapsulation layer 310, the organic encapsulation layer 320, and the second inorganic encapsulation layer 330 may cover the first transmitting portion TA1.

Figure 10:
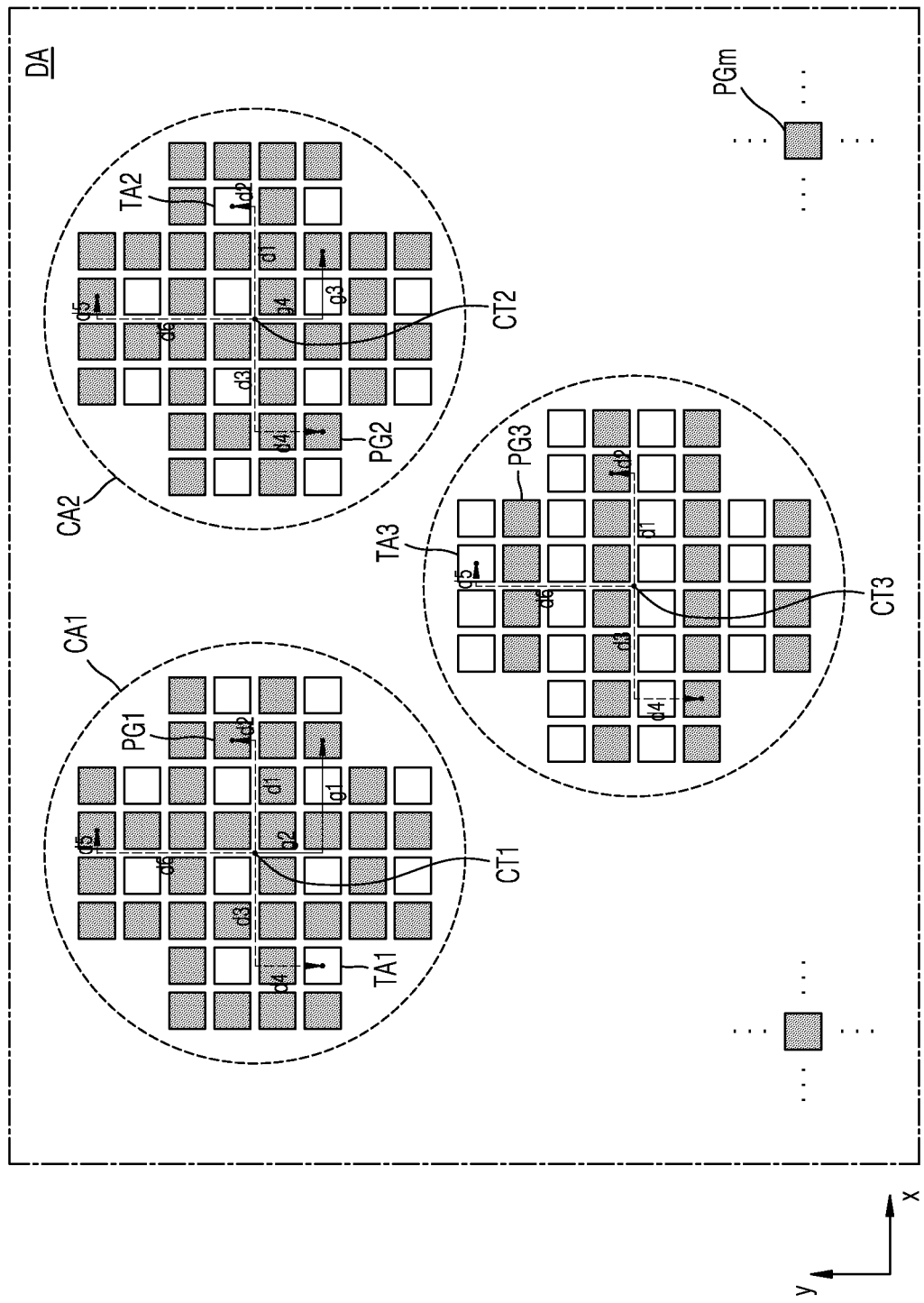
FIG. 10 is a plan view illustrating a part of a display panel according to another embodiment.

FIG. 10 is a plan view illustrating a part of a display panel according to another embodiment. In FIG. 10, the same members as those of FIG. 4 are denoted by the same reference numerals, and thus a repeated explanation will be omitted.

Referring to FIG. 10, the display panel may include the display area DA where the main pixel groups PGm are located, the first component area CA1 where the first transmitting portions TA1 and the first pixel groups PG1 are located, and the second component area CA2 where the second transmitting portions TA2 and the second pixel groups PG2 are located.

In the present embodiment, the display panel may further include a third component area CA3 where a third transmitting portion TA3 and a third pixel group PG3 are located. In an embodiment, the display area DA, the first component area CA1, the second component area CA2, and the third component area CA3 may be defined in a substrate of the display panel. That is, the substrate of the display panel may include the display area DA, the first component area CA1, the second component area CA2, and the third component area CA3. In this case, third auxiliary sub-pixels may be located in the third pixel group PG3. The third auxiliary sub-pixels that are third display elements may be implemented by third organic light-emitting diodes. Furthermore, a third component may be located under the third component area CA3.

In an embodiment, the first component area CA1, the second component area CA2, and the third component area CA3 may be located adjacent to one another. In this case, the first component area CA1, the second component area CA2, and the third component area CA3 may contact one another or may be spaced apart from one another. In another embodiment, the first component area CA1, the second component area CA2, and the third component area CA3 may be arranged in the first direction (x-direction) or the second direction (y-direction). The following will be described in detail assuming that the first component area CA1, the second component area CA2, and the third component area CA3 are located adjacent to one another.

In the present embodiment, a plurality of third transmitting portions TA3 may be located in the third component area CA3. Also, a plurality of third pixel groups PG3 may be located in the third component area CA3. In an embodiment, the plurality of third transmitting portions TA3 and the plurality of third pixel groups PG3 may be arranged in the first direction (x-direction) or the second direction (y-direction) according to a preset third arrangement order. In this case, the third arrangement order of the plurality of third transmitting portions TA3 and the plurality of third pixel groups PG3 may be different from the first arrangement order of the plurality of first transmitting portions TA1 and the plurality of first pixel groups PG1 and/or the second arrangement order of the plurality of second transmitting portions TA2 and the plurality of second pixel groups PG2.

In the present embodiment, when the second pixel group PG2 is located in the second component area CA2 at a position corresponding to a position of the first pixel group PG1 in the first component area CA1, the third transmitting portion TA3 may be located in the third component area CA3 at a position corresponding to the position of the first pixel group PG1 in the first component area CA1.

For example, the first pixel group PG1 may be spaced apart by a fifth distance d5 in the first direction (x-direction) from the first center CT1. Furthermore, the first pixel group PG1 may be spaced apart by a sixth distance d6 in the second direction (y-direction) intersecting the first direction from the first center CT1. The second pixel group PG2 may be spaced apart by the fifth distance d5 in the first direction (x-direction) from the second center CT2. Furthermore, the second pixel group PG2 may be spaced by the sixth distance d6 in the second direction (y-direction) intersecting the first direction from the second center CT2. In this case, the third transmitting portion TA3 may be spaced apart by the fifth distance d5 in the first direction (x-direction) from a third center CT3 of the third component area CA3. Furthermore, the third transmitting portion TA3 may be spaced apart by the sixth distance d6 in the second direction (y-direction) intersecting the first direction from the third center CT3.

In some embodiments, the second transmitting portion TA2 may be located in the second component area CA2 and the third transmitting portion TA3 may be located in the third component area CA3 to correspond to a position of the first pixel group PG1 in the first component area CA1.

In the present embodiment, when the third pixel group PG3 is located in the third component area CA3 at a position corresponding to a position of the second pixel group PG2 in the second component area CA2, the first transmitting portion TA1 may be located in the first component area CA1 at a position corresponding to the position of the second pixel group PG2 in the second component area CA2.

For example, the second pixel group PG2 may be spaced apart by the third distance d3 in the first direction (x-direction) from the second center CT2. Also, the second pixel group PG2 may be spaced apart by the fourth distance d4 in the second direction (y-direction) intersecting the first direction from the second center CT2. The third pixel group PG3 may be spaced by the fourth distance d4 in the first direction (x-direction) from the third center CT3. Furthermore, the third pixel group PG3 may be spaced apart by the fourth distance d4 in the second direction (y-direction) intersecting the first direction from the third center CT3. In this case, the first transmitting portion TA1 may be spaced apart by the third distance d3 in the first direction (x-direction) from the first center CT1. Furthermore, the first transmitting portion TA1 may be spaced apart by the fourth distance d4 in the second direction (y-direction) intersecting the first direction from the first center CT1.

In some embodiments, the third transmitting portion TA3 may be located in the third component area CA3 and the first transmitting portion TA1 may be located in the first component area CA1 to correspond to a position of the second pixel group PG2 in the second component area CA2.

In the present embodiment, when the first pixel group PG1 is located in the first component area CA1 at a position corresponding to a position of the third pixel group PG3 in the third component area CA3, the second transmitting portion TA2 may be located in the second component area CA2 at a position corresponding to the position of the third pixel group PG3 in the third component area CA3.

For example, the third pixel group PG3 may be spaced apart by the first distance d1 in the first direction (x-direction) from the third center CT3. Furthermore, the third pixel group PG3 may be spaced apart by the second distance d2 in the second direction (y-direction) intersecting the first direction from the third center CT3. The first pixel group PG1 may be spaced apart by the first distance d1 in the first direction (x-direction) from the first center CT1. Furthermore, the first pixel group PG1 may be spaced apart by the second distance d2 in the second direction (−y-direction) intersecting the first direction from the first center CT1. In this case, the second transmitting portion TA2 may be spaced apart by the first distance d1 in the first direction (x-direction) from the second center CT2. Furthermore, the second transmitting portion TA2 may be spaced by the second distance d2 in the second direction (y-direction) intersecting the first direction from the second center CT2.

In some embodiments, the first transmitting portion TA1 may be located in the first component area CA1 and the second transmitting portion TA2 may be located in the second component area CA2 to correspond to a position of the third pixel group PG3 in the third component area CA3.

That is, the first transmitting portion TA1 of the first component area CA1, the second transmitting portion TA2 of the second component area CA2, and the third transmitting portion TA3 of the third component area CA3 may be located at complementary positions. Accordingly, images obtained by the first component located under the first component area CA1, the second component located under the second component area CA2, and the third component area located under the third component area CA3 may be compensated for one another, thereby maintaining high image quality.

Furthermore, an area occupied by the first pixel group PG1 in the first component area CA1 per unit area, an area occupied by the second pixel group PG2 in the second component area CA2 per unit area, and an area occupied by the third pixel group PG3 in the third component area CA3 per unit area do not need to be minimized to maintain a transmittance. Accordingly, resolutions of the first component area CA1, the second component area CA2, and the third component area CA3 may be maintained.

Although the first component area CA1, the second component area CA2, and the third component area CA3 are provided in FIG. 10, in another embodiment, more component areas may be provided. For example, a fourth component area in addition to the first through third component areas CA1, CA2, and CA3 may be further provided.

Figure 11:
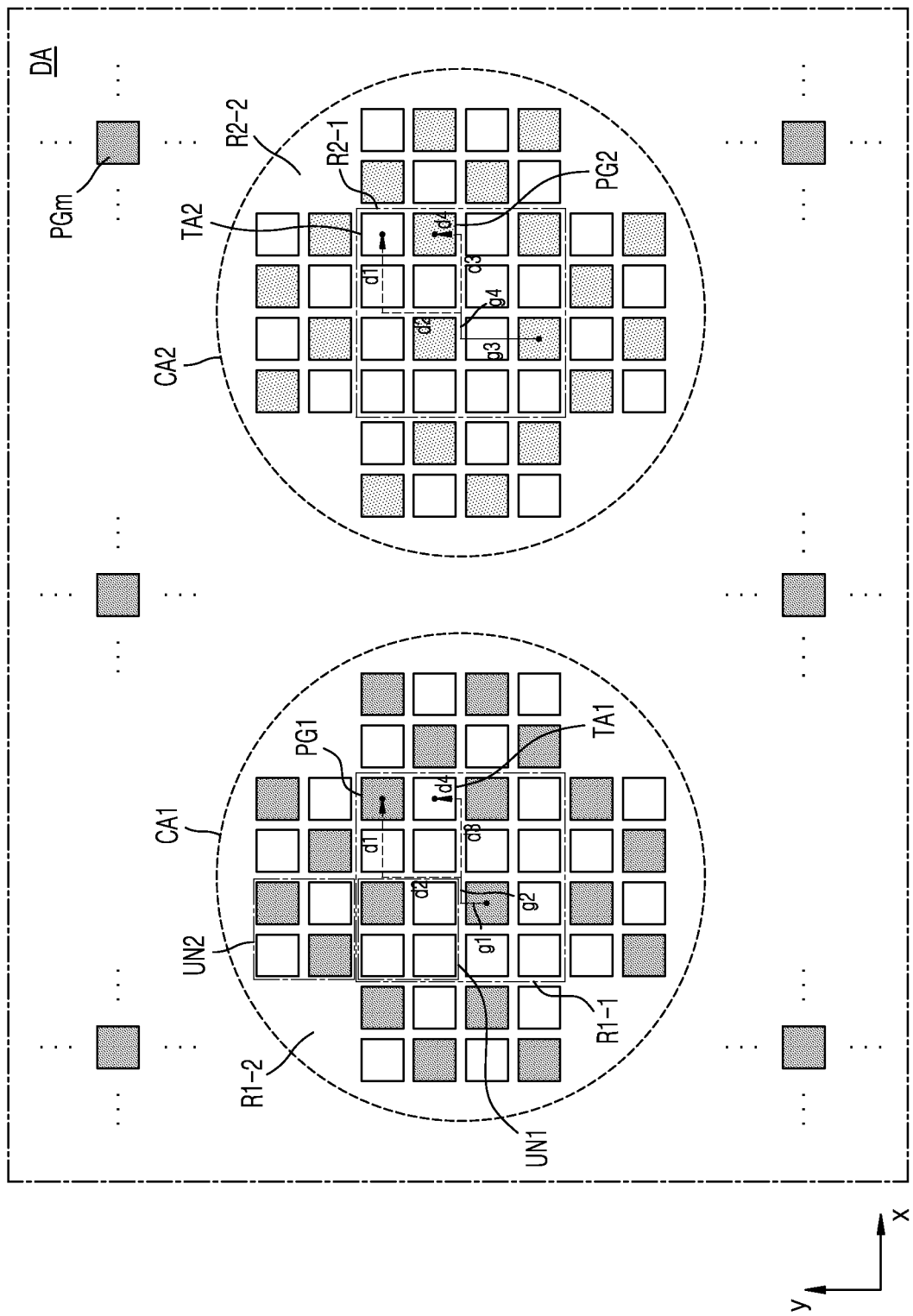
FIG. 11 is a plan view illustrating a part of a display panel according to another embodiment.

FIG. 11 is a plan view illustrating a part of a display panel according to another embodiment. In FIG. 11, the same members as those of FIG. 4 are denoted by the same reference numerals, and thus a repeated explanation will be omitted.

Referring to FIG. 11, the display panel may include the display area DA where the main pixel groups PGm are located, the first component area CA1 where the first transmitting portions TA1 and the first pixel groups PG1 are located, and the second component area CA2 where the second transmitting portions TA2 and the second pixel groups PG2 are located. In an embodiment, the display area DA, the first component area CA1, and the second component area CA2 may be defined in a substrate of the display panel. That is, the substrate of the display panel may include the display area DA, the first component area CA1, and the second component area CA2.

One of the first pixel groups PG1 may be spaced apart by the first distance d1 in the first direction (x-direction) from the first center CT1, and may be spaced apart by the second distance d2 in the second direction (y-direction) from the first center CT1. One of the second transmitting portions TA2 may be spaced apart by the first distance d1 in the first direction (x-direction) from the second center CT2, and may be spaced apart by the second distance d2 in the second direction (y-direction) from the second center CT2.

In the present embodiment, the first component area CA1 may include a first area R1-1 and a second area R1-2 surrounding the first area R1-1. In this case, in the same area, the number of first pixel groups PG1 located in the first area R1-1 may be less than the number of first pixel groups PG1 located in the second area R1-2. For example, a first area unit UN1 of the first area R1-1 may have a quadrangular shape including one first pixel group PG1 and three first transmitting portions TA1 around the one first pixel group PG1. A second area unit UN2 of the second area R1-2 may have a quadrangular shape including two first pixel groups PG1 and two first transmitting portions TA1 around the two first pixel groups PG1. Accordingly, one first pixel group PG1 may be included in the first area unit UN1, and two first pixel groups PG1 may be located in the second area unit UN2.

In the present embodiment, an area occupied by the first transmitting portion TA1 in the first area R1-1 may be greater than an area occupied by the first transmitting portion TA1 in the second area R1-2. For example, the first area unit UN1 may include three first transmitting portions TA1, whereas the second area unit UN2 may include two first transmitting portions TA1. Accordingly, an area occupied by the first transmitting portions TA1 in the first area UN1 may be greater than an area occupied by the first transmitting portions TA1 in the second area unit UN2.

In the present embodiment, because the number of main pixel groups PGm located in the display area DA per unit area, the number of first pixel groups PG1 located in the second area R1-2 per unit area, and the number of first pixel groups PG1 located in the first area R1-1 per unit area gradually decrease, a boundary between the display area DA and the first component area CA1 may not be viewable by an user.

The second component area CA2 may include a first area R2-1 and a second area R2-2 surrounding the first area R2-1, like the first component area CA1. The first area R2-1 of the second component area CA2 and the second area R2-2 of the second component area CA2 are similar to the first area R1-1 of the first component area CA1 and the second area R1-2 of the second component area CA1. Thus, a detailed explanation will be omitted.

As described above, according to embodiments, a display apparatus may include a first component area and a second component area, and second transmitting portions may be located in the second component area at positions corresponding to positions of first pixel groups in the first component area. Accordingly, resolutions of the first component area and the second component area may be maintained, and transmittances of the first component area and the second component area may increase.

Furthermore, because each component area includes a first area and a second are having a higher resolution than that of the first area, a sharp resolution change between a display area and the component area may be prevented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a display area;
a first component area where first pixel groups including first auxiliary sub-pixels and first transmitting portions are located; and
a second component area where second pixel groups including second auxiliary sub-pixels and second transmitting portions are located;
first display elements for implementing the first auxiliary sub-pixels; and
second display elements for implementing the second auxiliary sub-pixels,
wherein one of the first pixel groups is spaced apart by a first distance in a plus (+) direction of a first direction from a first center of the first component area, and is spaced apart by a second distance in a plus (+) direction of a second direction intersecting the first direction from the first center,
wherein one of the second transmitting portions is spaced apart by the first distance in the plus (+) direction of the first direction from a second center of the second component area, and is spaced apart by the plus (+) direction of the second distance in the second direction from the second center, and
wherein a total area of the first pixel groups is substantially equal to a total area of the second transmitting portions.

2. The display apparatus of claim 1, wherein one of the second pixel groups is spaced apart by a third distance in a minus (−) direction of the first direction from the second center, and is spaced apart by a fourth distance in a minus (−) direction of the second direction from the second center, and
wherein one of the first transmitting portions is spaced apart by the third distance in the minus (−) direction of the first direction from the first center, and is spaced apart by the fourth distance in the minus (−) direction of the second direction from the second center.

3. The display apparatus of claim 1, wherein main pixel groups including main sub-pixels are located in the display area,
wherein the display apparatus further comprises main display elements for implementing the main sub-pixels, and
wherein, in a same area, a number of the main sub-pixels is greater than a number of the first auxiliary sub-pixels.

4. The display apparatus of claim 3, wherein, in a same area, a number of the main sub-pixels is twice larger than a number of the first auxiliary sub-pixels.

5. The display apparatus of claim 3, wherein, in a same area, a number of the main sub-pixels is four times larger than a number of the first auxiliary sub-pixels.

6. The display apparatus of claim 1, wherein the first auxiliary sub-pixels include a red sub-pixel, a green sub-pixel, and a blue sub-pixel.

7. The display apparatus of claim 6, wherein the red sub-pixel, the green sub-pixel, and the blue sub-pixel form a virtual quadrangular shape,
wherein the red sub-pixel and the blue sub-pixel are located at vertices of the virtual quadrangular shape to face a center point of the virtual quadrangular shape, and
the green sub-pixel is located at the center point of the virtual quadrangular shape.

8. The display apparatus of claim 1, wherein the substrate further includes a third component area where third pixel groups including third auxiliary sub-pixels and third transmitting portions are located, and
wherein the display apparatus further comprises third display elements for implementing the third auxiliary sub-pixels.

9. The display apparatus of claim 1, wherein the first component area includes a first area and a second area surrounding the first area, and
wherein, in a same area, a number of the first pixel groups located in the first area is less than a number of the first pixel groups located in the second area.

10. The display apparatus of claim 1, wherein the first component area includes a first area and a second area surrounding the first area, and
wherein, in a same area, an area occupied by the first transmitting portions in the first area is greater than an area occupied by the first transmitting portions in the second area.

11. The display apparatus of claim 1, further comprising:
a first component located under the first component area; and
a second component located under the second component area.

12. The display apparatus of claim 11, wherein the first component and the second component are cameras.

13. A display apparatus comprising:
a substrate comprising a display area;
a first component area where first pixel groups including first auxiliary sub-pixels and first transmitting portions are located; and
a second component area where second pixel groups including second auxiliary sub-pixels and second transmitting portions are located;
first display elements for implementing the first auxiliary sub-pixels; and
second display elements for implementing the second auxiliary sub-pixels,
wherein the first pixel groups and the second pixel groups are disposed at symmetrical positions to each other with respect to an imaginary straight line, the imaginary straight line being orthogonal to a connecting line at a center of the connecting line connecting the first center and the second center, and
wherein a total area of the first pixel groups is substantially equal to a total area of the second transmitting portions.

14. The display apparatus of claim 13, wherein the first transmitting portions and the second transmitting portions are disposed at symmetrical positions to each other with respect to the imaginary straight line.

15. The display apparatus of claim 13, wherein main pixel groups including main sub-pixels are located in the display area,
wherein the display apparatus further comprises main display elements for implementing the main sub-pixels, and
wherein, in a same area, a number of the main sub-pixels is greater than a number of the first auxiliary sub-pixels.

16. The display apparatus of claim 13, wherein the first auxiliary sub-pixels includes a red sub-pixel, a green sub-pixel, and a blue sub-pixel,
wherein the red sub-pixel, the green sub-pixel, and the blue sub-pixel form a virtual quadrangular shape,
wherein the red sub-pixel and the blue sub-pixel are located at vertices of the virtual quadrangular shape to face a center of the virtual quadrangular shape, and
wherein the green sub-pixel is located at the center of the virtual quadrangular shape.

17. The display apparatus of claim 13, wherein the first component area includes a first area and a second area surrounding the first area, and
wherein, in a same area, a number of the first pixel groups located in the first area is less than a number of the first pixel groups located in the second area.

18. A display apparatus comprising:
a substrate comprising a display area;
a first component area where first pixel groups including first auxiliary sub-pixels and first transmitting portions are located; and
a second component area where second pixel groups including second auxiliary sub-pixels and second transmitting portions are located;
first display elements for implementing the first auxiliary sub-pixels; and
second display elements for implementing the second auxiliary sub-pixels,
wherein the first component area and the second component area are located on both sides of a center line extending in a first direction or a second direction intersecting the first direction to be spaced apart from each other,
wherein a total area of the first pixel groups is substantially equal to a total area of the second transmitting portions, and
wherein the first pixel groups and the first transmitting portions are differently arranged from the second pixel groups and the second transmitting portions.

19. The display apparatus of claim 18, wherein one of the first pixel groups is spaced apart by a first distance in the first direction from a first center of the first component area, and is spaced apart by a second distance in the second direction from the first center, and
wherein one of the second transmitting portions is spaced apart by the first distance in the first direction from a second center of the second component area, and is spaced apart by the second distance in the second direction from the second center.

20. The display apparatus of claim 18, wherein the display apparatus is folded about the center line.

* * * * *